United States Patent
Mizuno et al.

(10) Patent No.: US 9,828,466 B2
(45) Date of Patent: Nov. 28, 2017

(54) POLYPHENYLENE ETHER DERIVATIVE HAVING N-SUBSTITUTED MALEIMIDE GROUP, AND HEAT CURABLE RESIN COMPOSITION, RESIN VARNISH, PREPREG, METAL-CLAD LAMINATE, AND MULTILAYER PRINTED WIRING BOARD USING SAME

(71) Applicant: HITACHI CHEMICAL COMPANY, LTD., Tokyo (JP)

(72) Inventors: Yasuyuki Mizuno, Tokyo (JP); Tomio Fukuda, Tokyo (JP); Takao Tanigawa, Tokyo (JP); Yuki Nagai, Tokyo (JP); Hikari Murai, Tokyo (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days.

(21) Appl. No.: 15/301,655

(22) PCT Filed: Apr. 6, 2015

(86) PCT No.: PCT/JP2015/060787
§ 371 (c)(1),
(2) Date: Nov. 8, 2016

(87) PCT Pub. No.: WO2015/152427
PCT Pub. Date: Oct. 8, 2015

(65) Prior Publication Data
US 2017/0051109 A1 Feb. 23, 2017

(30) Foreign Application Priority Data

Apr. 4, 2014 (JP) .................. 2014-078246
Apr. 4, 2014 (JP) .................. 2014-078247
Aug. 7, 2014 (JP) .................. 2014-161280

(51) Int. Cl.
| | |
|---|---|
| C08G 65/48 | (2006.01) |
| C08J 5/24 | (2006.01) |
| C08K 3/00 | (2006.01) |
| C08K 5/3415 | (2006.01) |
| C08L 63/00 | (2006.01) |
| C08L 71/12 | (2006.01) |
| H05K 1/03 | (2006.01) |
| C08L 63/04 | (2006.01) |
| C09D 171/12 | (2006.01) |
| C08G 73/10 | (2006.01) |

(52) U.S. Cl.
CPC ........... C08G 65/485 (2013.01); C08G 65/48 (2013.01); C08J 5/24 (2013.01); C08K 3/00 (2013.01); C08K 5/3415 (2013.01); C08L 63/00 (2013.01); C08L 63/04 (2013.01); C08L 71/12 (2013.01); C08L 71/126 (2013.01); C09D 171/12 (2013.01); H05K 1/0326 (2013.01); H05K 1/0373 (2013.01); C08G 73/1071 (2013.01); C08J 2371/12 (2013.01); C08J 2400/24 (2013.01); C08L 2201/02 (2013.01); C08L 2201/08 (2013.01); C08L 2203/20 (2013.01)

(58) Field of Classification Search
CPC .................................................... C08G 65/485
See application file for complete search history.

(56) References Cited

U.S. PATENT DOCUMENTS

| | | | |
|---|---|---|---|
| 5,523,360 | A | 6/1996 | Jelenic et al. |
| 5,834,565 | A | 11/1998 | Tracy et al. |
| 2009/0312519 | A1 | 12/2009 | Uera et al. |

(Continued)

FOREIGN PATENT DOCUMENTS

| | | |
|---|---|---|
| EP | 0506611 A2 | 9/1992 |
| EP | 2141198 A1 | 1/2010 |

(Continued)

OTHER PUBLICATIONS

International Search Report for PCT/JP2015/060787 dated Jun. 30, 2015; English translation submitted herewith (5 Pages).

(Continued)

*Primary Examiner* — Michael Pepitone
(74) *Attorney, Agent, or Firm* — Fitch, Even, Tabin & Flannery, LLP

(57) ABSTRACT

A polyphenylene ether derivative having at least one N-substituted maleimide group represented by the following general formula (I) in a molecule, and a heat curable resin composition, a prepreg, a metal-clad laminate, and a multilayer printed wiring board, each of which uses the polyphenylene ether derivative:

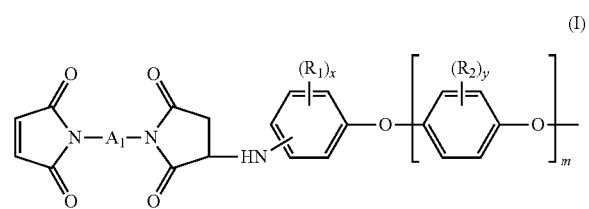

(I)

wherein $R_1$ each independently represents a hydrogen atom, an aliphatic hydrocarbon group having 1 to 5 carbon atoms, or a halogen atom, $R_2$ each independently represents a hydrogen atom, an aliphatic hydrocarbon group having 1 to 5 carbon atoms, or a halogen atom, $A_1$ represents a residual group represented by a specific general formula, m is an integer of 1 or more as the number of the structural unit, and x and y each is an integer of 1 to 4.

17 Claims, No Drawings

(56) References Cited

U.S. PATENT DOCUMENTS

| | | |
|---|---|---|
| 2012/0329957 A1 | 12/2012 | Uera et al. |
| 2014/0235126 A1 | 8/2014 | Mori et al. |

FOREIGN PATENT DOCUMENTS

| | | |
|---|---|---|
| JP | 56-133355 A | 10/1981 |
| JP | 58-69046 A | 4/1983 |
| JP | 59-193929 A | 11/1984 |
| JP | 61-18937 B2 | 5/1986 |
| JP | 3-275760 A | 12/1991 |
| JP | 05-156003 A | 6/1993 |
| JP | 07-508550 A | 9/1995 |
| JP | 11-302529 A | 11/1999 |
| JP | 2000-509097 A | 7/2000 |
| JP | 2008-95061 A | 4/2008 |
| JP | 2009-062530 A | 3/2009 |
| JP | 2010-018791 A | 1/2010 |
| JP | 2010-138364 A | 6/2010 |
| WO | 2008/089314 A1 | 7/2008 |

OTHER PUBLICATIONS

International Preliminary Report on Patentability dated Oct. 4, 2016, for International Application No. PCT/JP2015/060787, together with English language translation thereof.

Written Opinion of International Searching Authority (ISA/JP) dated Jun. 30, 2015, for International Application No. PCT/JP2015/060787, together with English language translation thereof.

Huang, P., et al., "High-Performance Hyperbranched Poly(phenylene oxide) Modified Bismaleimide Resin with High Thermal Stability, Low Dielectric Constant and Loss", Journal of Applied Polymer Science DOI 10-1002/app, pp. 451-457, Wiley Online Library, Received May 21, 2010, Accepted Aug. 9, 2010, Published Oct. 14, 2010.

Extended European Search Report dated Mar. 14, 2017, for European Application No. 15772464.2.

POLYPHENYLENE ETHER DERIVATIVE HAVING N-SUBSTITUTED MALEIMIDE GROUP, AND HEAT CURABLE RESIN COMPOSITION, RESIN VARNISH, PREPREG, METAL-CLAD LAMINATE, AND MULTILAYER PRINTED WIRING BOARD USING SAME

CROSS-REFERENCE TO RELATED APPLICATIONS

This application is a 371 application of International Application No. PCT/JP2015/060787, filed on Apr. 6, 2015, which claims priority of Japanese Application No. 2014-161280, filed on Aug. 7, 2014, Japanese Application No. 2014-078247, filed on Apr. 4, 2014, and Japanese Application No. 2014-078246, filed on Apr. 4, 2014.

TECHNICAL FIELD

The present invention relates to a polyphenylene ether derivative having at least one N-substituted maleimide group in a molecule, and a heat curable resin composition, a resin varnish, a prepreg, a metal-clad laminate, and a multilayer printed wiring board, each of which uses the polyphenylene ether derivative. More particularly, the present invention is concerned with a heat curable resin composition having excellent compatibility, and particularly having high frequency properties (low dielectric constant and low dissipation factor), high adhesion to a conductor, excellent heat resistance, low thermal expansion property, and high flame retardancy as well as high glass transition temperature, a resin varnish, a prepreg, a metal-clad laminate, and a multilayer printed wiring board, and a polyphenylene ether derivative used in these materials.

BACKGROUND ART

Signals used in mobile communication devices, such as a cell phone, base station apparatuses for them, network infrastructure devices, such as a server and a router, large-sized computers, and the like are being increased in the speed and capacity. In accordance with this, printed wiring boards mounted on these electronic devices are required to adapt to high-frequency signals, and a substrate material having excellent high frequency properties (low dielectric constant and low dissipation factor) that enable reduction of a transmission loss is demanded. As examples of the applications handling high-frequency signals, there can be mentioned the above electronic devices, the ITS field (in connection with automobile and traffic system), and the indoor short-distance communication field. It is expected that the printed wiring boards to be mounted on these devices will be further required to use a substrate material exhibiting a low transmission loss.

Further, in view of the environmental problems encountered in recent years, mounting of electronic parts using a lead-free solder and achieving flame retardancy free of a halogen are demanded, and therefore the material for a printed wiring board is needed to have higher heat resistance and more excellent flame retardancy than conventional.

Conventionally, as a resin composition used in a printed wiring board required to have a low transmission loss, one using a polyphenylene ether (PPO, PPE) and a thermosetting resin in combination has been proposed. Specifically, examples of such resin compositions include a resin composition containing a polyphenylene ether and an epoxy resin (see, for example, PTL 1), a resin composition using a polyphenylene ether in connection with a cyanate ester resin having a low dielectric constant among the thermosetting resins (see, for example, PTL 2), a resin composition using a polyphenylene ether in connection with a bismaleimide compound having high heat resistance among the thermosetting resins (see, for example, PTL 3), a resin composition using a polyphenylene ether in connection with a crosslinking polymer, such as a polybutadiene resin (see, for example, PTL 4), and a resin composition using a polyphenylene ether in connection with a crosslinking monomer, such as triallyl isocyanurate (see, for example, PTL 5).

However, the resin compositions described in the above-mentioned PTL's 1 to 5 are unsatisfactory collectively in the high frequency properties in the GHz region, the adhesion to a conductor, the thermal expansion property, and the flame retardancy. In addition, the compatibility of polyphenylene ether with a thermosetting resin is low, and therefore the resultant resin composition is unsatisfactory in heat resistance. When the polyphenylene ether ratio in the resin composition is increased for suppressing the deterioration of the high frequency properties, the resistance to chemicals (solvents), heat resistance, and formability of the resin composition tend to be insufficient.

Further, a method in which a polyphenylene ether and various types of phenols are reacted to lower the molecular weight simultaneously with introducing a functional group, such as an amino group, into the polyphenylene ether (for example, PTL 6) has been known. In the resin composition using a polyphenylene ether and a thermosetting resin in combination obtained by this method, like the above-mentioned resin compositions, the compatibility and formability are improved, but the heat resistance, glass transition temperature, and high frequency properties tend to be poor, and further the flame retardancy is likely to be unsatisfactory.

Meanwhile, the present inventors have proposed a resin composition having a polyphenylene ether resin and a polybutadiene resin as a base, wherein the resin composition can be improved in the compatibility, heat resistance, thermal expansion property, adhesion to a conductor, and the like by performing semi-IPN formation in the production stage (A-stage) of a varnish (resin composition) (for example, PTL 7). However, the substrate material recently used for a printed wiring board is not only required to adapt to high-frequency signals, but also required to have higher adhesion to a conductor, low thermal expansion property, high glass transition temperature, high flame retardancy, and the like due to the demands for an increase of the density, high reliability, and adaptability to consideration of the environment.

For example, for securing the microwiring forming properties and high reflow heat resistance while maintaining the high frequency properties (suppressing the increase of a transmission loss caused due to roughness of a conductor or the like), the adhesion to a conductor is desired to be 0.6 kN/m or more, in terms of a copper foil peel strength as measured using a low profile copper foil (Rz: 1 to 2 μm) having very small surface roughness on the side to be bonded to the resin.

Further, the substrate material for printed wiring board used in the application of network related devices, such as a server and a router, is needed to be stacked into the increased number of layers as the density of the wiring board is increased, and therefore the substrate material is required to have high reflow heat resistance and through-hole reliability. The glass transition temperature of the material as a yardstick for the above properties is desirably 190° C. or higher, further desirably 200° C. or higher, and the low thermal expansion property (in the Z-direction at the Tg or lower) is desirably 45 ppm/° C. or less, further desirably 40 ppm/° C. or less. For achieving low thermal expansion property, the incorporation of an inorganic filler into the resin composition is effective; however, in a multilayer printed wiring board with the increased number of layers, for surely obtaining the flow properties of the resin for circuit packing, the amount of the inorganic filler used is restricted. Therefore, it is desired that even when the amount of the inorganic filler incorporated is as relatively small as 25% by volume or less, based on the volume of the resin composition, the resultant resin composition secures the above-mentioned required values.

With respect to the high frequency properties, when using a general E glass substrate, the substrate material desirably has a dielectric constant of 3.7 or less, further desirably 3.6 or less, and desirably has a dissipation factor of 0.007 or less, further desirably 0.006 or less. Furthermore, the substrate material is increasingly strongly needed to satisfy the above-mentioned required values in a 10 GHz or more band which is a frequency band higher than the conventional 1 to 5 GHz band for the dielectric properties values.

CITATION LIST

Patent Literature

PTL 1: JP-A-58-69046
PTL 2: JP-B-61-18937
PTL 3: JP-A-56-133355
PTL 4: JP-A-59-193929
PTL 5: JP-A-3-275760
PTL 6: JP-T-2000-509097 (The term "JP-T" as used herein means a published Japanese translation of a PCT patent application.)
PTL 7: JP-A-2008-95061

SUMMARY OF INVENTION

Technical Problem

Accordingly, an object of the present invention is to provide a heat curable resin composition having especially excellent compatibility and having high frequency properties (low dielectric constant and low dissipation factor), high adhesion to a conductor, excellent heat resistance, low thermal expansion property, and high flame retardancy as well as high glass transition temperature, and a prepreg, a metal-clad laminate, and a multilayer printed wiring board, each of which uses the resin composition. Another object is to provide a polyphenylene ether derivative used in the thermoplastic resin composition or the like and a method for producing the same.

Solution to Problem

The present inventors have conducted extensive and intensive studies with a view toward solving the above-mentioned problems. As a result, it has been found that a prepreg and a laminate using a heat curable resin composition containing the polyphenylene ether derivative having a specific molecular structure can achieve the above-mentioned object, and the present invention has been completed.

That is, the present invention is directed to the below-described polyphenylene ether derivative, and a heat curable resin composition, a resin varnish, a prepreg, a metal-clad laminate, and a multilayer printed wiring board, each of which uses the polyphenylene ether derivative.

1. A polyphenylene ether derivative (A) having at least one N-substituted maleimide group represented by the following general formula (I) in a molecule:

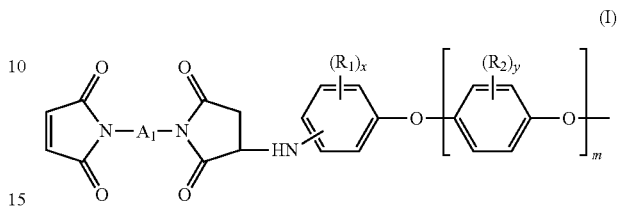

wherein $R_1$ each independently represents a hydrogen atom, an aliphatic hydrocarbon group having 1 to 5 carbon atoms, or a halogen atom, $R_2$ each independently represents a hydrogen atom, an aliphatic hydrocarbon group having 1 to 5 carbon atoms, or a halogen atom, $A_1$ represents a residual group represented by the following general formula (II), (III), (IV), or (V), m is an integer of 1 or more as the number of the structural unit, and x and y each is an integer of 1 to 4,

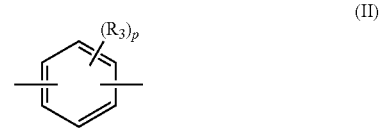

wherein $R_3$ each independently represents a hydrogen atom, an aliphatic hydrocarbon group having 1 to 5 carbon atoms, or a halogen atom, and p is an integer of 1 to 4,

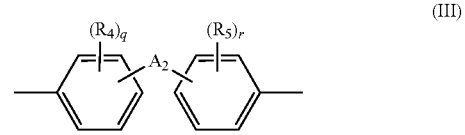

wherein $R_4$ and $R_5$ each independently represents a hydrogen atom, an aliphatic hydrocarbon group having 1 to 5 carbon atoms, or a halogen atom, $A_2$ represents an alkylene group or alkylidene group having 1 to 5 carbon atoms, an ether group, a sulfide group, a sulfonyl group, a carbonyloxy group, a ketone group, a single bond, or a residual group represented by the following general formula (III-1), and q and r each is an integer of 1 to 4,

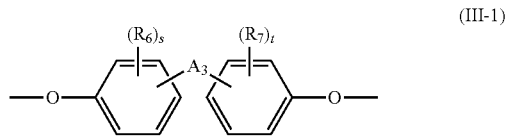

wherein $R_6$ and $R_7$ each independently represents a hydrogen atom, an aliphatic hydrocarbon group having 1 to 5 carbon atoms, or a halogen atom, $A_3$ represents an alkylene group having 1 to 5 carbon atoms, an isopropylidene group, an ether group, a sulfide group, a sulfonyl group, a carbonyloxy group, a ketone group, or a single bond, and s and t each is an integer of 1 to 4,

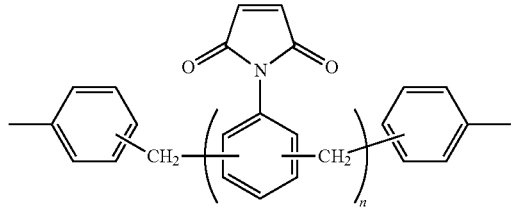
(IV)

wherein n is an integer of 1 to 10,

(V)

wherein $R_8$ and $R_9$ each independently represents a hydrogen atom or an aliphatic hydrocarbon group having 1 to 5 carbon atoms, and u is an integer of 1 to 8.

2. The polyphenylene ether derivative (A) according to item 1 above, wherein the N-substituted maleimide group includes at least one represented by the following formula (I-1), (I-2), or (I-3):

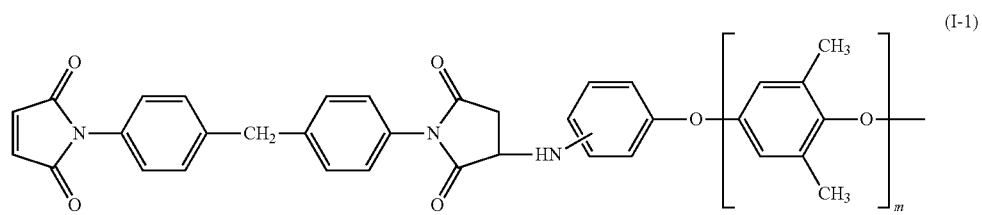
(I-1)

wherein m is as defined for the general formula (I),

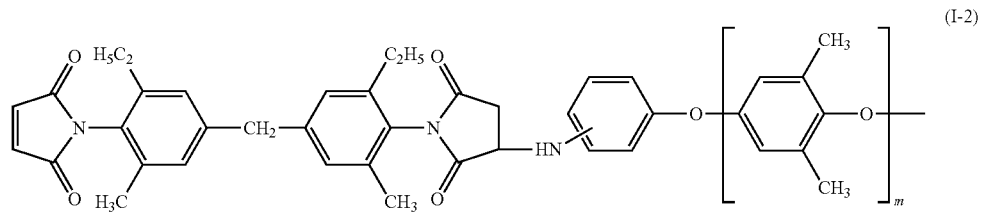
(I-2)

wherein m is as defined for the general formula (I),

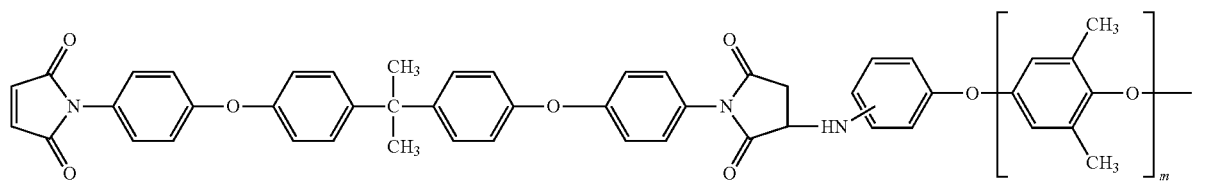
(I-3)

wherein m is as defined for the general formula (I).

3. A heat curable resin composition containing the polyphenylene ether derivative (A) according to item 1 or 2 above and a thermosetting resin (B).

4. The heat curable resin composition according to item 3 above, wherein the polyphenylene ether derivative (A) has a number average molecular weight of 5,000 to 12,000.

5. The heat curable resin composition according to item 3 or 4 above, wherein the thermosetting resin (B) is at least one selected from the group consisting of an epoxy resin, a cyanate ester resin, and a maleimide compound.

6. The heat curable resin composition according to item 5 above, wherein the maleimide compound as the thermosetting resin (B) includes a bismaleimide compound (a) having at least two N-substituted maleimide groups in a molecule, or a polyaminobismaleimide compound (c) represented by the following general formula (VI):

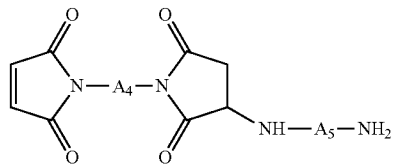
(VI)

wherein $A_4$ is a residual group represented by the following general formula (VII), (VIII), (IX), or (X), and $A_5$ is a residual group represented by the following general formula (XI):

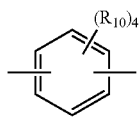
(VII)

wherein $R_{10}$ each independently represents a hydrogen atom, an aliphatic hydrocarbon group having 1 to 5 carbon atoms, or a halogen atom,

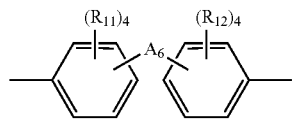
(VIII)

wherein $R_{11}$ and $R_{12}$ each independently represents a hydrogen atom, an aliphatic hydrocarbon group having 1 to 5 carbon atoms, or a halogen atom, and $A_6$ represents an alkylene group or alkylidene group having 1 to 5 carbon atoms, an ether group, a sulfide group, a sulfonyl group, a carbonyloxy group, a ketone group, a single bond, or a residual group represented by the following general formula (VIII-1):

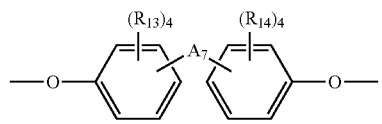
(VIII-1)

wherein $R_{13}$ and $R_{14}$ each independently represents a hydrogen atom, an aliphatic hydrocarbon group having 1 to 5 carbon atoms, or a halogen atom, and $A_7$ represents an alkylene group having 1 to 5 carbon atoms, an isopropylidene group, an ether group, a sulfide group, a sulfonyl group, a carbonyloxy group, a ketone group, or a single bond,

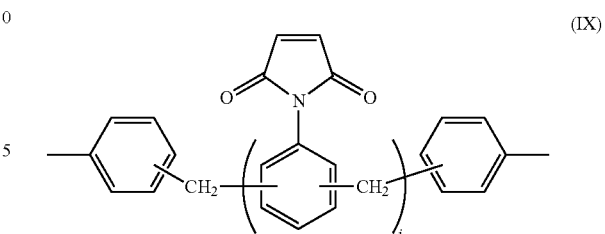
(IX)

wherein i is an integer of 1 to 10,

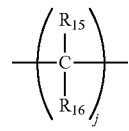
(X)

wherein $R_{15}$ and $R_{16}$ each independently represents a hydrogen atom or an aliphatic hydrocarbon group having 1 to 5 carbon atoms, and j is an integer of 1 to 8,

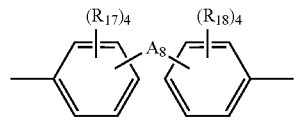
(XI)

wherein $R_{17}$ and $R_{18}$ each independently represents a hydrogen atom, an aliphatic hydrocarbon group having 1 to 5 carbon atoms, an alkoxy group having 1 to 5 carbon atoms, a hydroxyl group, or a halogen atom, and $A_8$ represents an alkylene group or alkylidene group having 1 to 5 carbon atoms, an ether group, a sulfide group, a sulfonyl group, a carbonyloxy group, a ketone group, a fluorenylene group, a single bond, or a residual group represented by the following general formula (XI-1) or (XI-2):

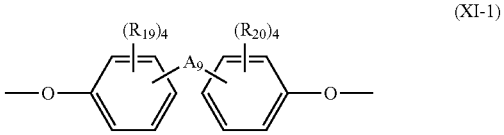
(XI-1)

wherein $R_{19}$ and $R_{20}$ each independently represents a hydrogen atom, an aliphatic hydrocarbon group having 1 to 5 carbon atoms, or a halogen atom, and $A_9$ represents an alkylene group having 1 to 5 carbon atoms, an isopropylidene group, a m- or p-phenylenediisopropylidene group, an ether group, a sulfide group, a sulfonyl group, a carbonyloxy group, a ketone group, or a single bond,

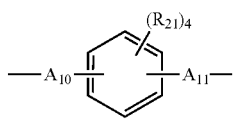

(XI-2)

wherein $R_{21}$ each independently represents a hydrogen atom, an aliphatic hydrocarbon group having 1 to 5 carbon atoms, or a halogen atom, and $A_{10}$ and $A_{11}$ each represents an alkylene group having 1 to 5 carbon atoms, an isopropylidene group, an ether group, a sulfide group, a sulfonyl group, a carbonyloxy group, a ketone group, or a single bond.

7. The heat curable resin composition according to any one of items 3 to 6 above, wherein the ratio of the polyphenylene ether derivative (A) and thermosetting resin (B) contained is in the range of: (A):(B)=(5 to 80% by mass):(95 to 20% by mass).

8. The heat curable resin composition according to any one of items 3 to 7 above, which further contains an inorganic filler (C).

9. The heat curable resin composition according to any one of items 3 to 8 above, which further contains a flame retardant (D).

10. The heat curable resin composition according to any one of items 3 to 9 above, which further contains a curing accelerator (E).

11. The heat curable resin composition according to any one of items 3 to 10 above, which further contains a phenolic antioxidant (F).

12. The heat curable resin composition according to any one of items 3 to 11 above, wherein the resin composition after being cured has a glass transition temperature of 200° C. or higher.

13. A resin varnish obtained using the heat curable resin composition according to any one of items 3 to 12 above and an organic solvent.

14. A prepreg obtained using the resin varnish according to item 13 above.

15. A laminate obtained using the prepreg according to item 14 above.

16. A multilayer printed wiring board formed using the prepreg according to item 14 above or the laminate according to item 15 above.

17. A method for producing the polyphenylene ether derivative (A) according to item 1 or 2 above, wherein the method has the steps of: reacting a phenol compound having at least one primary amino group in a molecule and being represented by the following general formula (XII) with a polyphenylene ether having a structure represented by the following general formula (XIII) and having a number average molecular weight of 15,000 to 25,000 in an organic solvent to produce a polyphenylene ether compound having a primary amino group; and reacting the obtained polyphenylene ether compound with a bismaleimide compound having at least two N-substituted maleimide groups in a molecule and being represented by the following general formula (XIV):

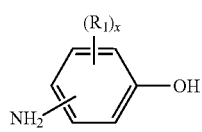

(XII)

wherein $R_1$ each independently represents a hydrogen atom, an aliphatic hydrocarbon group having 1 to 5 carbon atoms, or a halogen atom, and x is an integer of 1 to 4,

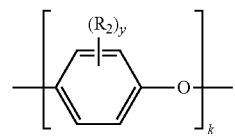

(XIII)

wherein $R_2$ each independently represents a hydrogen atom, an aliphatic hydrocarbon group having 1 to 5 carbon atoms, or a halogen atom, y is an integer of 1 to 4, and k is an integer of 1 or more,

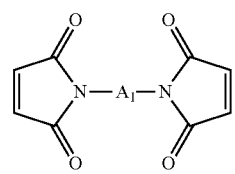

(XIV)

wherein $A_1$ is as defined for the general formula (I).

Advantageous Effects of Invention

The polyphenylene ether derivative (A) having a specific structure of the present invention has excellent solubility in an organic solvent, and a heat curable resin composition containing the polyphenylene ether derivative has excellent compatibility, and particularly has high frequency properties (low dielectric constant and low dissipation factor), high adhesion to a conductor, excellent heat resistance, low thermal expansion property, and high flame retardancy as well as high glass transition temperature. Therefore, a prepreg and a laminate each obtained using the heat curable resin composition can be advantageously used in electronic parts applications, such as a multilayer printed wiring board.

DESCRIPTION OF EMBODIMENTS

Hereinbelow, embodiments of the present invention will be described in detail.

The polyphenylene ether derivative (A) having at least one N-substituted maleimide group in a molecule of the present invention (hereinafter, frequently referred to simply as "polyphenylene ether derivative (A)") has an N-substituted maleimide group represented by the following general formula (I).

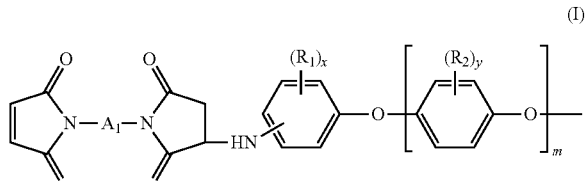

(I)

In the general formula (I), $R_1$ each independently represents a hydrogen atom, an aliphatic hydrocarbon group having 1 to 5 carbon atoms, or a halogen atom, $R_2$ each independently represents a hydrogen atom, an aliphatic hydrocarbon group having 1 to 5 carbon atoms, or a halogen atom, $A_1$ represents a residual group represented by the following general formula (II), (III), (IV), or (V), m is an integer of 1 or more as the number of the structural unit, and x and y each is an integer of 1 to 4.

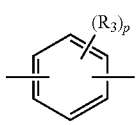
(II)

In the general formula (II), $R_3$ each independently represents a hydrogen atom, an aliphatic hydrocarbon group having 1 to 5 carbon atoms, or a halogen atom, and p is an integer of 1 to 4.

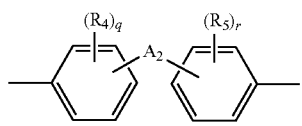
(III)

In the general formula (III), $R_4$ and $R_5$ each independently represents a hydrogen atom, an aliphatic hydrocarbon group having 1 to 5 carbon atoms, or a halogen atom, $A_2$ represents an alkylene group or alkylidene group having 1 to 5 carbon atoms, an ether group, a sulfide group, a sulfonyl group, a carbonyloxy group, a ketone group, a single bond, or a residual group represented by the following general formula (III-1), and q and r each is an integer of 1 to 4.

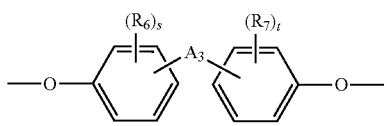
(III-1)

In the general formula (III-1), $R_6$ and $R_7$ each independently represents a hydrogen atom, an aliphatic hydrocarbon group having 1 to 5 carbon atoms, or a halogen atom, $A_3$ represents an alkylene group having 1 to 5 carbon atoms, an isopropylidene group, an ether group, a sulfide group, a sulfonyl group, a carbonyloxy group, a ketone group, or a single bond, and s and t each is an integer of 1 to 4.

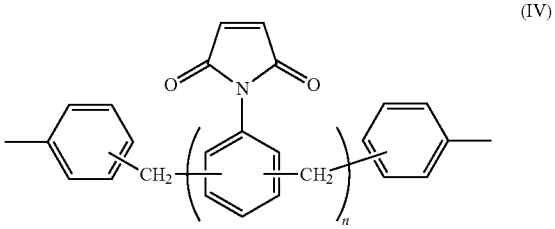
(IV)

In the general formula (IV), n is an integer of 1 to 10.

(V)

In the general formula (V), $R_8$ and $R_9$ each independently represents a hydrogen atom or an aliphatic hydrocarbon group having 1 to 5 carbon atoms, and u is an integer of 1 to 8.

In the polyphenylene ether derivative (A) of the present invention, it is preferred that the N-substituted maleimide group includes at least one represented by the following formula (I-1), (I-2), or (I-3).

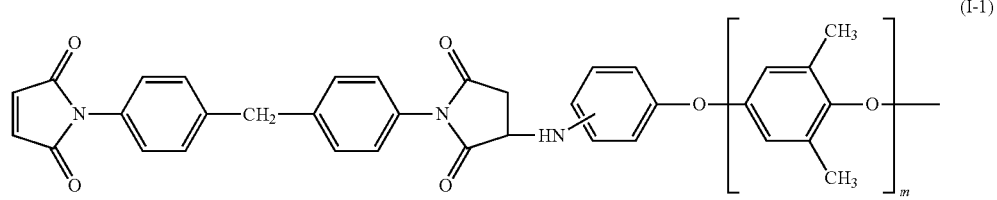
(I-1)

In the general formula (I-1), m is as defined for the general formula (I) above.

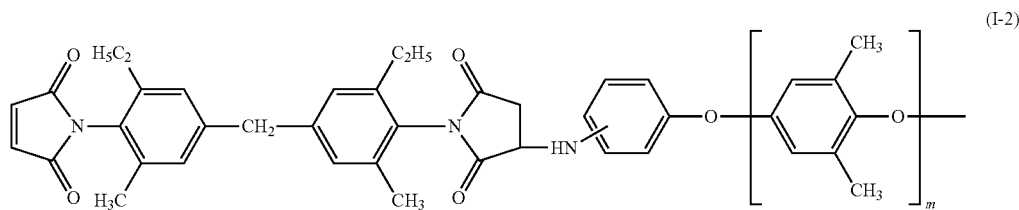

(I-2)

In the general formula (I-2), m is as defined for the general formula (I) above.

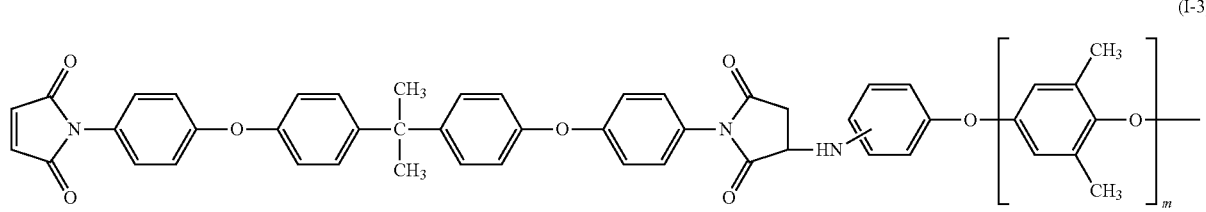

(I-3)

In the general formula (I-3), m is as defined for the general formula (I) above.

The polyphenylene ether derivative having an N-substituted maleimide group of the formula (I-1) above is preferred because the raw materials therefor are inexpensive. The polyphenylene ether derivative having an N-substituted maleimide group of the formula (I-2) above is preferred because it exhibits excellent dielectric properties and low water absorption properties. The polyphenylene ether derivative having an N-substituted maleimide group of the formula (I-3) above is preferred because it exhibits high adhesion to a conductor and excellent elongation as well as excellent mechanical properties (such as breaking strength). Accordingly, according to the intended properties, the polyphenylene ether derivative may include one of or two or more of these polyphenylene ether derivatives having the N-substituted maleimide groups of the above formulae.

In the formula (I) above, m value is an integer of 1 or more as the number of the structural unit, and is not particularly limited. The polyphenylene ether derivative (A) of the present invention preferably has a number average molecular weight of, for example, 5,000 to 12,000, further preferably 7,000 to 10,000. When the number average molecular weight of the polyphenylene ether derivative is 5,000 or more, the heat curable resin composition of the present invention and a prepreg and a laminate using the resin composition are likely to achieve further excellent glass transition temperature. Further, when the number average molecular weight of the polyphenylene ether derivative is 12,000 or less, it is likely that further excellent formability can be obtained upon using the heat curable resin composition of the present invention in a laminate.

Next, the polyphenylene ether derivative (A) of the present invention can be obtained by, for example, the method described below. First, a primary amino group-containing phenol compound represented by the general formula (XII) below (hereinafter, frequently referred to simply as "primary amino group-containing phenol compound") and a polyphenylene ether having a number average molecular weight of 15,000 to 25,000 and being represented by the general formula (XIII) below are, for example, as disclosed in the above-mentioned PTL 6, subjected to redistribution reaction in an organic solvent so as to reduce the polyphenylene ether in the molecular weight, producing a polyphenylene ether compound (A') having a primary amino group in a molecule (hereinafter, frequently referred to simply as "polyphenylene ether compound (A')"). Then, the produced polyphenylene ether compound (A') and a bismaleimide compound represented by the general formula (XIV) are subjected to Michael addition reaction.

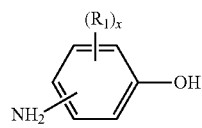

(XII)

In the general formula (XII), $R_1$ and x are as defined for the general formula (I) above.

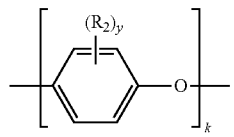

(XIII)

In the general formula (XIII), $R_2$ and y are as defined for the general formula (I) above, and k is an integer of 1 or more as the number of the repeating unit.

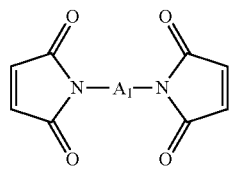

(XIV)

In the general formula (XIV), $A_1$ is as defined for the general formula (I) above.

As examples of the primary amino group-containing phenol compounds represented by the general formula (XII) above, there can be mentioned o-aminophenol, m-aminophenol, and p-aminophenol. With respect to the primary amino group-containing phenol compound, from the viewpoint of the reaction yield upon producing the polyphenylene ether compound (A') and the heat resistance of a resin composition, a prepreg, and a laminate each obtained using the resultant compound, m-aminophenol and p-aminophenol are preferred.

The molecular weight of the polyphenylene ether compound (A') can be controlled by changing the amount of the primary amino group-containing phenol compound incorporated or the like. For example, as the amount of the primary amino group-containing phenol compound incorporated is increased, the polyphenylene ether compound (A') tends to be lowered in the molecular weight. That is, the amount of the primary amino group-containing phenol compound incorporated can be appropriately controlled so that the molecular weight of the finally produced polyphenylene ether derivative (A) of the present invention becomes a preferred number average molecular weight. With respect to the amount of the incorporated primary amino group-containing phenol compound represented by the general formula (XII) above, there is no particular limitation. However, for example, relative to 100 parts by mass of the polyphenylene ether having a number average molecular weight of 15,000 to 25,000 and being represented by the general formula (XIII) above, the primary amino group-containing phenol compound may be used in an amount in the range of from 0.5 to 6 parts by mass. When the primary amino group-containing phenol compound is used in an amount in the above range, the polyphenylene ether derivative (A) having the above-mentioned preferred number average molecular weight can be obtained.

With respect to the polyphenylene ether having a number average molecular weight of 15,000 to 25,000 and being represented by the general formula (XIII), there is no particular limitation. However, examples of the polyphenylene ethers include poly(2,6-dimethyl-1,4-phenylene) ether obtained by homopolymerizing 2,6-dimethylphenol, poly(2,3,6-trimethyl-1,4-phenylene) ether obtained by homopolymerizing 2,3,6,-trimethylphenol, and a copolymer of 2,6-dimethylphenol and 2,3,6,-trimethylphenol.

With respect to the organic solvent used in the production step for the polyphenylene ether compound (A'), there is no particular limitation. However, examples of organic solvents include alcohols, such as methanol, ethanol, butanol, butyl-cellosolve, ethylene glycol monomethyl ether, and propylene glycol monomethyl ether; ketones, such as acetone, methyl ethyl ketone, methyl isobutyl ketone, and cyclohexanone; aromatic hydrocarbons, such as toluene, xylene, and mesitylene; esters, such as methoxyethyl acetate, ethoxyethyl acetate, butoxyethyl acetate, and ethyl acetate; and nitrogen-containing solvents, such as N,N-dimethylformamide, N,N-dimethylacetamide, and N-methyl-2-pyrrolidone. These may be used individually or in combination. From the viewpoint of the solubility, toluene, xylene, and mesitylene are preferred.

In the production step for the polyphenylene ether compound (A'), if necessary, a reaction catalyst can be used. With respect to the reaction catalyst, the reaction catalyst used in the redistribution reaction disclosed in the above-mentioned PTL 6 or the like can be applied. For example, an organic peroxide, such as t-butylperoxyisopropyl monocarbonate, and a metal carboxylate, such as manganese naphthenate, are preferably used in combination because the polyphenylene ether compound (A') having a number average molecular weight stabilized can be obtained with high reproducibility. With respect to the amount of the reaction catalyst used, there is no particular limitation, and an example of the amount disclosed in the above-mentioned PTL 6 or the like can be applied. For example, relative to 100 parts by mass of the polyphenylene ether having a number average molecular weight of 15,000 to 25,000 and being represented by the general formula (XIII) above, 0.5 to 5 parts by mass of an organic peroxide and 0.05 to 0.5 part by mass of a metal carboxylate are preferably used from the viewpoint of the reaction rate and prevention of gelation or the like upon producing the polyphenylene ether compound (A').

The above-mentioned raw materials for synthesis, an organic solvent, and, if necessary, a reaction catalyst or the like in predetermined amounts are charged into a synthesis vessel, and subjected to reaction while heating, maintaining the temperature, and stirring to obtain a polyphenylene ether compound (A'). With respect to the reaction conditions for this step including a reaction temperature and a reaction time, the reaction conditions employed in the redistribution reaction disclosed in the above-mentioned PTL 6 can be applied. For example, the reaction is preferably conducted at a reaction temperature in the range of from 70 to 110° C. for a reaction time in the range of from 1 to 8 hours from the viewpoint of the working properties and prevention of gelation and the like.

The thus produced polyphenylene ether compound (A') may be continuously supplied to the subsequent step for producing a polyphenylene ether derivative (A) without removing the contents from the synthesis vessel. In this instance, the solution of the polyphenylene ether compound (A') may be cooled, or set or adjusted to the reaction temperature for the next step. Further, the solution of the polyphenylene ether compound may be, as mentioned below, if necessary, concentrated by removing part of the organic solvent, or may be diluted by further adding thereto an organic solvent.

Examples of the bismaleimide compound represented by the general formula (XIV), which is used in producing the polyphenylene ether derivative (A) of the present invention, include bis(4-maleimidophenyl)methane, polyphenylmethanemaleimide, bis(4-maleimidophenyl) ether, bis(4-maleimidophenyl) sulfone, 3,3'-dimethyl-5,5'-diethyl-4,4'-diphenylmethanebismaleimide, 4-methyl-1,3-phenylenebismaleimide, m-phenylenebismaleimide, 2,2-bis(4-(4-maleimidophenoxy)phenyl)propane, bis(4-maleimidophenyl) sulfone, bis(4-maleimidophenyl) sulfide, bis(4-maleimidophenyl) ketone, 2,2-bis(4-(4-maleimidophenoxy)phenyl)propane, bis(4-(4-maleimidophenoxy) phenyl) sulfone, 4,4'-bis(3-maleimidophenoxy)biphenyl, and 1,6-bismaleimido-(2,2,4-trimethyl)hexane. These may be used individually or in combination.

Of these, bis(4-maleimidophenyl)methane, 3,3'-dimethyl-5,5'-diethyl-4,4'-diphenylmethanebismaleimide, and 2,2-bis(4-(4-maleimidophenoxy)phenyl)propane are preferably used. Bis(4-maleimidophenyl)methane is preferably used because the polyphenylene ether derivative containing the formula (I-1) above is obtained and it is inexpensive. 3,3'-Dimethyl-5,5'-diethyl-4,4'-diphenylmethanebismaleimide is preferably used because the polyphenylene ether derivative containing the formula (I-2) above is obtained and exhibits excellent dielectric properties and low water absorption properties. 2,2-Bis(4-(4-maleimidophenoxy)phenyl)propane is preferably used because the polyphenylene ether derivative containing the formula (I-3) above is obtained and exhibits high adhesion to a conductor and excellent mechanical properties, such as elongation and breaking strength.

The amount of the bismaleimide compound represented by the general formula (XIV) above used is determined according to the amount of the primary amino group-containing phenol compound used. Specifically, the bismaleimide compound is preferably incorporated so that the equivalent ratio (Tb1/Ta1) of the maleimide group equivalent (Tb1) of the bismaleimide compound represented by the general formula (XIV) to the —$NH_2$ group equivalent (Ta1) of the primary amino group-containing phenol compound is in the range of from 2.0 to 6.0, further preferably in the range of from 2.0 to 4.0. When the bismaleimide compound is used so that the equivalent ratio (Tb1/Ta1) is in the above range, the heat curable resin composition, prepreg, and laminate of the present invention are likely to achieve further excellent heat resistance, flame retardancy, and glass transition temperature.

In the Michael addition reaction conducted when producing the polyphenylene ether derivative (A) of the present invention, there is no need to use a reaction catalyst but, if necessary, a reaction catalyst can be used. With respect to the reaction catalyst used, there is no particular limitation. However, examples of reaction catalysts include acidic catalysts, such as p-toluenesulfonic acid; amines, such as triethylamine, pyridine, and tributylamine; imidazoles, such as methylimidazole and phenylimidazole; and phosphorus catalysts, such as triphenylphosphine. These may be used individually or in combination. With respect to the amount of the reaction catalyst incorporated, there is no particular limitation. However, for example, relative to 100 parts by mass of the bismaleimide compound, the reaction catalyst can be used in an amount in the range of from 0.01 to 5.0 parts by mass.

The bismaleimide compound represented by the general formula (XIV) above, and, if necessary, a reaction catalyst or the like in predetermined amounts are charged into the solution of the polyphenylene ether compound (A') and subjected to Michael addition reaction, obtaining the polyphenylene ether derivative (A) of the present invention. In this step, heating, maintaining the temperature, and stirring may be appropriately performed. In this step, the reaction is preferably conducted under reaction conditions, for example, at a reaction temperature in the range of from 50 to 160° C. for a reaction time in the range of from 1 to 10 hours from the viewpoint of the working properties and prevention of gelation or the like. Further, in this step, as mentioned above, the reaction concentration (solids content) and solution viscosity can be controlled by further adding an organic solvent or concentrating the solution. As the organic solvent to be further added, the organic solvents mentioned above as examples in connection with the production step for the polyphenylene ether compound (A') can be applied. These may be used individually or in combination. With respect to the organic solvent used, for example, from the viewpoint of the solubility, methyl ethyl ketone, cyclohexanone, propylene glycol monomethyl ether, N,N-dimethylformamide, and N,N-dimethylacetamide may be used.

With respect to the reaction concentration (solids content) in the production steps for the polyphenylene ether derivative (A) and polyphenylene ether compound (A'), there is no particular limitation. For example, in each of the above production steps, the reaction concentration is preferably 10 to 60% by mass, more preferably 20 to 50% by mass. When the reaction concentration is 10% by mass or more, the reaction rate is unlikely to be too small, which is advantageous in view of the production cost. Further, when the reaction concentration is 60% by mass or less, further excellent solubility is likely to be obtained and high stirring efficiency is achieved, and further gelation is unlikely to occur.

After producing the polyphenylene ether derivative (A) of the present invention, according to the working properties for removing the content from the synthesis vessel and the state where the polyphenylene ether derivative (A) is used in preparing a resin composition by adding various thermosetting resins thereto (for example, the solution viscosity or solution concentration suitable for the production of a prepreg), the solution of the derivative may be appropriately concentrated by removing part of or all of the organic solvent in the solution, or diluted by further adding thereto an organic solvent. With respect to the organic solvent to be further added, there is no particular limitation, and the above-mentioned one or more organic solvents can be applied.

The formation of the polyphenylene ether compound (A') and the polyphenylene ether derivative (A) of the present invention obtained by the above-mentioned production steps can be confirmed by a GPC measurement and an IR measurement made with respect to a small amount of a sample taken after completion of the individual steps. First, with respect to the polyphenylene ether compound (A'), the production of a desired polyphenylene ether compound (A') can be confirmed by a GPC measurement showing that the molecular weight is reduced to be lower than the polyphenylene ether having a number average molecular weight of 15,000 to 25,000 and that the peak of the primary amino group-containing phenol compound as a raw material has disappeared, and an IR measurement showing that a peak of a primary amino group appears at 3,300 to 3,500 $cm^{-1}$. With respect to the polyphenylene ether derivative (A) which has been purified by reprecipitation, the production of a desired derivative (A) can be confirmed by an IR measurement showing that the peak of a primary amino group at 3,300 to 3,500 $cm^{-1}$ has disappeared and that a peak of a carbonyl group of maleimide appears at 1,700 to 1,730 $cm^{-1}$.

The heat curable resin composition of the present invention contains the above-mentioned polyphenylene ether derivative (A) (hereinafter, frequently referred to as "component (A)") and a thermosetting resin (B) (hereinafter, frequently referred to as "component (B)"). With respect to the component (B), there is no particular limitation as long as it is a thermosetting resin. However, it is preferred that the component (B) is at least one selected from the group consisting of an epoxy resin, a cyanate ester resin, and a maleimide compound. By virtue of containing the component (A) and the component (B), the heat curable resin composition can be further improved in high adhesion to a conductor, heat resistance, low thermal expansion property, flame retardancy, processability (drilling and cutting) and the like, as compared to a resin composition containing the component (B) and merely the polyphenylene ether compound (A') obtained before producing the polyphenylene ether derivative (A) of the present invention.

The above-mentioned maleimide compound does not include the polyphenylene ether derivative (A).

With respect to the epoxy resin as the component (B), there is no particular limitation. Examples of epoxy resins as the component (B) include bisphenol A epoxy resins, bisphenol F epoxy resins, bisphenol S epoxy resins, alicyclic epoxy resins, aliphatic linear epoxy resins, phenolic novolak epoxy resins, cresol novolak epoxy resins, bisphenol A novolak epoxy resins, phenolic aralkyl epoxy resins, naphthalene skeleton-containing epoxy resins, such as naphthol novolak epoxy resins and naphthol aralkyl epoxy resins, difunctional biphenyl epoxy resins, biphenylaralkyl epoxy resins, dicyclopentadiene epoxy resins, and dihydroanthracene epoxy resins. These may be used individually or in combination. With respect to the epoxy resin as the component (B), naphthalene skeleton-containing epoxy resins and biphenylaralkyl epoxy resins are preferably used from the viewpoint of the high frequency properties, heat resistance, thermal expansion property, flame retardancy, and glass transition temperature.

When an epoxy resin is used as the component (B), if necessary, a curing agent or a curing auxiliary for the epoxy resin can be used. With respect to the curing agent and curing auxiliary, there is no particular limitation, but examples include polyamine compounds, such as diethylenetriamine, triethylenetetramine, diaminodiphenylmethane, m-phenylenediamine, and dicyandiamide; polyphenol compounds, such as bisphenol A, phenolic novolak resins, cresol novolak resins, bisphenol A novolak resins, and phenolic aralkyl resins; acid anhydrides, such as phthalic anhydride and pyromellitic anhydride; various carboxylic acid compounds, and various active ester compounds. These may be used individually or in combination. The amount of the curing agent or curing auxiliary used is not particularly limited, and can be appropriately controlled according to the purpose. With respect to the curing agent and curing auxiliary, from the viewpoint of the heat resistance, glass transition temperature, thermal expansion property, storage stability, insulation reliability and the like, various polyphenol compounds and active ester compounds are preferably used.

With respect to the cyanate ester resin as the component (B), there is no particular limitation. Examples of cyanate ester resins as the component (B) include 2,2-bis(4-cyanatophenyl)propane, bis(4-cyanatophenyl)ethane, bis(3,5-dimethyl-4-cyanatophenyp)methane, 2,2-bis(4-cyanatophenyl)-1,1,1,3,3,3-hexafluoropropane, α,α'-bis(4-cyanatophenyl)-m-diisopropylbenzene, cyanate ester compounds of a phenol-added dicyclopentadiene polymer, phenolic novolak cyanate ester compounds, and cresol novolak cyanate ester compounds. These may be used individually or in combination. With respect to the cyanate ester resin as the component (B), 2,2-bis(4-cyanatophenyl)propane is preferably used from the viewpoint of the inexpensiveness and improvement of the total balance between the high frequency properties and the other properties.

When a cyanate ester resin is used as the component (B), if necessary, a curing agent or a curing auxiliary for the cyanate ester resin can be used. With respect to the curing agent and curing auxiliary, there is no particular limitation, but examples include various monophenol compounds, various polyphenol compounds, various amine compounds, various alcohol compounds, various acid anhydrides, and various carboxylic acid compounds. These may be used individually or in combination. The amount of the curing agent or curing auxiliary used is not particularly limited, and can be appropriately controlled according to the purpose. Of the above compounds, from the viewpoint of the high frequency properties, heat resistance, moisture absorption resistance, and storage stability, various monophenol compounds are preferably used.

When a cyanate ester resin and a monophenol compound are used in combination, from the viewpoint of the solubility in a solvent, it is preferred that the cyanate ester resin and monophenol compound are used in the form of a phenol-modified cyanate prepolymer obtained by subjecting the cyanate ester resin and monophenol compound to a preliminary reaction to such an extent that they suffer no gelation. With respect to the monophenol compound to be used in combination with the cyanate ester resin, all the specified amount of the monophenol compound may be incorporated when forming a prepolymer, or the divided portions of the specified amount of the monophenol compound may be incorporated separately before and after forming a prepolymer, but it is preferred that the divided portions of the monophenol compound are separately incorporated from the viewpoint of the storage stability of the varnish.

With respect to the maleimide compound used as the component (B), there is no particular limitation. However, for example, it is preferred that the maleimide compound includes a bismaleimide compound (a) having at least two N-substituted maleimide groups in a molecule (hereinafter, frequently referred to as "component (a)") or a polyaminobismaleimide compound (c) represented by the general formula (VI) below (hereinafter, frequently referred to as "component (c)"). From the viewpoint of the solubility in an organic solvent, high frequency properties, high adhesion to a conductor, and formability of a prepreg, the polyaminobismaleimide compound (c) is more preferably used.

The polyaminobismaleimide compound (c) is obtained by, for example, subjecting the component (a) and an aromatic diamine compound (b) having two primary amino groups in a molecule (hereinafter, frequently referred to as "component (b)") to Michael addition reaction in an organic solvent.

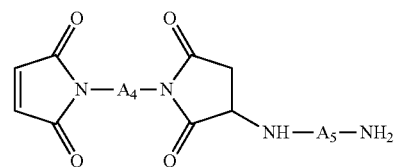

(VI)

In the general formula (VI), $A_4$ is a residual group represented by the general formula (VII), (VIII), (IX), or (X) below, and $A_5$ is a residual group represented by the general formula (XI) below.

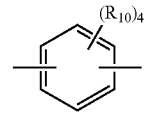

(VII)

In the general formula (VII), $R_{10}$ each independently represents a hydrogen atom, an aliphatic hydrocarbon group having 1 to 5 carbon atoms, or a halogen atom.

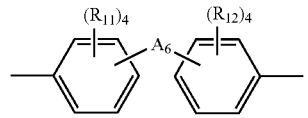

(VIII)

In the general formula (VIII), $R_{11}$ and $R_{12}$ each independently represents a hydrogen atom, an aliphatic hydrocarbon group having 1 to 5 carbon atoms, or a halogen atom, and $A_6$ represents an alkylene group or alkylidene group having 1 to 5 carbon atoms, an ether group, a sulfide group, a sulfonyl group, a carbonyloxy group, a ketone group, a single bond, or a residual group represented by the following general formula (VIII-1).

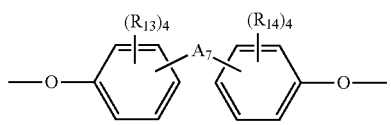
(VIII-1)

In the general formula (VIII-1), $R_{13}$ and $R_{14}$ each independently represents a hydrogen atom, an aliphatic hydrocarbon group having 1 to 5 carbon atoms, or a halogen atom, and $A_7$ represents an alkylene group having 1 to 5 carbon atoms, an isopropylidene group, an ether group, a sulfide group, a sulfonyl group, a carbonyloxy group, a ketone group, or a single bond.

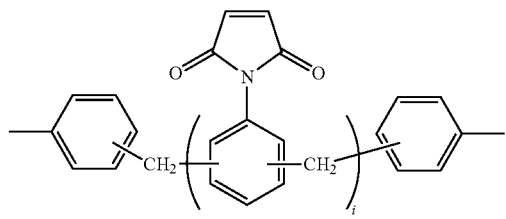
(IX)

In the general formula (IX), i is an integer of 1 to 10.

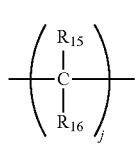
(X)

In the general formula (X), $R_{15}$ and $R_{16}$ each independently represents a hydrogen atom or an aliphatic hydrocarbon group having 1 to 5 carbon atoms, and j is an integer of 1 to 8.

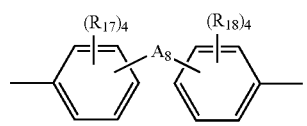
(XI)

In the general formula (XI), $R_{17}$ and $R_{18}$ each independently represents a hydrogen atom, an aliphatic hydrocarbon group having 1 to 5 carbon atoms, an alkoxy group having 1 to 5 carbon atoms, a hydroxyl group, or a halogen atom, and $A_8$ represents an alkylene group or alkylidene group having 1 to 5 carbon atoms, an ether group, a sulfide group, a sulfonyl group, a carbonyloxy group, a ketone group, a fluorenylene group, a single bond, or a residual group represented by the following general formula (XI-1) or (XI-2).

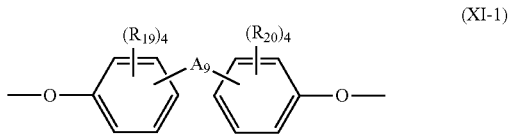
(XI-1)

In the general formula (XI-1), $R_{19}$ and $R_{20}$ each independently represents a hydrogen atom, an aliphatic hydrocarbon group having 1 to 5 carbon atoms, or a halogen atom, and $A_9$ represents an alkylene group having 1 to 5 carbon atoms, an isopropylidene group, a m- or p-phenylenediisopropylidene group, an ether group, a sulfide group, a sulfonyl group, a carbonyloxy group, a ketone group, or a single bond.

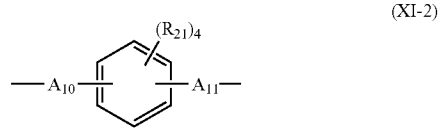
(XI-2)

In the general formula (XI-2), $R_{21}$ each independently represents a hydrogen atom, an aliphatic hydrocarbon group having 1 to 5 carbon atoms, or a halogen atom, and $A_{10}$ and $A_{11}$ each represents an alkylene group having 1 to 5 carbon atoms, an isopropylidene group, an ether group, a sulfide group, a sulfonyl group, a carbonyloxy group, a ketone group, or a single bond.

With respect to the bismaleimide compound having at least two N-substituted maleimide groups in a molecule as the component (a), there is no particular limitation. As the component (a), for example, those mentioned above as examples of the bismaleimide compound represented by the general formula (XIV) used in producing the polyphenylene ether derivative (A) of the present invention can be similarly applied. These may be used individually or in combination. Further, with respect to the component (a), bis(4-maleimidophenyl)methane is preferably used because it is inexpensive. 3,3'-Dimethyl-5,5'-diethyl-4,4'-diphenylmethanebismaleimide is preferably used because the resultant composition exhibits excellent dielectric properties and low water absorption properties. 2,2-Bis(4-(4-maleimidophenoxy)phenyl)propane is preferably used because the resultant composition exhibits high adhesion to a conductor, excellent elongation, and excellent mechanical properties (such as breaking strength). According to the purpose and use or the like, these may be used individually or in combination.

When the polyaminobismaleimide compound (c) represented by the general formula (VI) above is contained as the component (B), the component (c) can be obtained by subjecting the above-mentioned component (a) and aromatic diamine compound (b) having two primary amino groups in a molecule to Michael addition reaction in an organic solvent.

With respect to the component (b), there is no particular limitation, but examples include 4,4'-diaminodiphenylmethane, 4,4'-diamino-3,3'-dimethyl-diphenylmethane, 4,4'-diamino-3,3'-diethyl-diphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3-dimethyl-5,5-diethyl- 4,4-diphenylmethane diamine, 2,2-bis(4-aminophenyl)propane, 2,2-bis(4-(4-aminophenoxy)phenyl)propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis(1-4-(4-aminophenoxy)phenyl)-1-methylethyl)benzene, 1,4-bis(1-4-(4-aminophenoxy)phenyl)-1-methylethyl)benzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)]bisaniline, bis(4-(4-aminophenoxy)phenyl) sulfone, bis(4-(3-aminophenoxy)phenyl) sulfone, and 9,9-bis(4-aminophenyl)fluorene. These components (b) may be used individually or in combination.

With respect to the component (b), from the viewpoint of achieving high solubility in an organic solvent and high reaction rate for the synthesis as well as high heat resistance, preferred are 4,4'-diaminodiphenylmethane, 4,4'-diamino-3,3'-dimethyl-diphenylmethane, 4,4'-diamino-3,3'-diethyl-diphenylmethane, 2,2-bis(4-(4-aminophenoxy)phenyl)propane, 4,4'-[1,3-phenylenebis(1-methylethylidene)]bisaniline, and 4,4'-[1,4-phenylenebis(1-methylethylidene)]bisaniline. From the viewpoint of the inexpensiveness in addition to the above-mentioned high solubility, high reaction rate, and high heat resistance, preferred are 4,4'-diaminodiphenylmethane, 4,4'-diamino-3,3'-dimethyl-diphenylmethane, and 4,4'-diamino-3,3'-diethyl-diphenylmethane. Further, from the viewpoint of achieving high adhesion to a conductor in addition to the above-mentioned high solubility, high reaction rate, and high heat resistance, preferred are 2-bis(4-(4-aminophenoxy)phenyl)propane, 4,4'-[1,3-phenylenebis(1-methylethylidene)]bisaniline, and 4,4'-[1,4-phenylenebis(1-methylethylidene)]bisaniline. Furthermore, from the viewpoint of achieving excellent high-frequency properties and low moisture absorption in addition to the above-mentioned high solubility, high reaction rate, high heat resistance, and high adhesion to a conductor, 4,4'-[1,3-phenylenebis(1-methylethylidene)]bisaniline and 4,4'-[1,4-phenylenebis(1-methylethylidene)]bisaniline are more preferably used. According to the purpose or the like, these may be used individually or in combination.

With respect to the organic solvent used in producing the polyaminobismaleimide compound (c), there is no particular limitation. However, for example, the organic solvents mentioned above as examples in connection with the production step for the polyphenylene ether compound (A') can be applied. These may be used individually or in combination. Of these, methyl ethyl ketone, cyclohexanone, propylene glycol monomethyl ether, N,N-dimethylformamide, and N,N-dimethylacetamide are preferred from the viewpoint of the solubility.

With respect to the amounts of the component (a) and component (b) used in producing the component (c), the component (a) and component (b) are preferably incorporated so that the equivalent ratio (Tb2/Ta2) of the maleimide group equivalent (Tb2) of the component (a) to the —NH$_2$ group equivalent (Ta2) of the component (b) is in the range of from 1.0 to 10.0, more preferably in the range of from 2.0 to 10.0. When the component (a) and component (b) are used so that the equivalent ratio (Tb2/Ta2) is in the above range, the heat curable resin composition, prepreg, and laminate of the present invention are likely to achieve further excellent high-frequency properties, adhesion to a conductor, heat resistance, flame retardancy, and glass transition temperature.

In the above-mentioned Michael addition reaction conducted when producing the polyaminobismaleimide compound (c), there is no need to use a reaction catalyst but, if necessary, a reaction catalyst can be used. With respect to the reaction catalyst, there is no particular limitation, but the reaction catalyst usable in the Michael addition reaction conducted when producing the above-mentioned polyphenylene ether derivative (A) of the present invention can be applied. As mentioned above, there is no particular limitation with respect to the amount of the reaction catalyst incorporated.

When a maleimide compound, such as a bismaleimide compound (a) or a polyaminobismaleimide compound (c), is used as the component (B), a curing agent, a crosslinking agent, or a curing auxiliary for the maleimide compound can be used. With respect to the curing agent, crosslinking agent, and curing auxiliary, there is no particular limitation, but examples include various vinyl compounds, such as styrene monomer, divinylbenzene, and divinylbiphenyl; various (meth)acrylate compounds; various allyl compounds, such as triallyl cyanurate and triallyl isocyanurate; and various polyamine compounds, such as diaminodiphenylmethane. These may be used individually or in combination. The amount of the curing agent, crosslinking agent, or curing auxiliary used is not particularly limited, and can be appropriately controlled according to the purpose. Of the above compounds, from the viewpoint of the high frequency properties, heat resistance and the like, various vinyl compounds and various polyamine compounds are preferably used.

The above-mentioned component (a), component (b), organic solvent, and, if necessary, a reaction catalyst or the like in predetermined amounts are charged into a synthesis vessel and subjected to Michael addition reaction, obtaining the polyaminobismaleimide compound (c). In this step, heating, maintaining the temperature, and stirring may be appropriately performed. With respect to the reaction conditions for this step including a reaction temperature and a reaction time, for example, the reaction conditions for the above-mentioned Michael addition reaction conducted when producing the polyphenylene ether derivative (A) of the present invention can be applied. With respect to the reaction concentration (solids content), there is no particular limitation, but the reaction concentration is, for example, preferably 10 to 90% by mass, more preferably 20 to 80% by mass. When the reaction concentration is 10% by mass or more, the reaction rate is not too small, which is advantageous in view of the production cost. Further, when the reaction concentration is 90% by mass or less, excellent solubility can be obtained and high stirring efficiency is achieved, and further gelation is unlikely to occur. Like the production of the polyphenylene ether derivative (A), according to the purpose, after producing the polyaminobismaleimide compound (c), the resultant solution may be concentrated by removing part of or all of the organic solvent, and can be diluted by further adding thereto an organic solvent.

With respect to the amount of each of the component (A) and component (B) used, there is no particular limitation. However, the component (A) and component (B) are preferably used so that the ratio of the component (A) and component (B) contained (in terms of a solids content) becomes in the range of: (A):(B)=(5 to 80% by mass):(95 to 20% by mass), more preferably in the range of: (A):(B)=(5 to 75% by mass):(95 to 25% by mass), especially preferably in the range of: (A):(B)=(5 to 70% by mass):(95 to 30% by mass). When the content of the component (A) in the resin composition is 5% by mass or more, further excellent high-frequency properties and moisture absorption resistance are likely to be obtained. Further, when the content of the component (A) in the resin composition is 80% by mass or less, further excellent heat resistance, formability, and processability are likely to be obtained.

The heat curable resin composition of the present invention, if necessary, may use an inorganic filler (C) (hereinafter, frequently referred to as "component (C)"), a flame retardant (D) (hereinafter, frequently referred to as "component (D)"), a curing accelerator (E) (hereinafter, frequently referred to as "component (E)"), an antioxidant, particularly a phenolic antioxidant (F) (hereinafter, frequently referred to as "component (F)"), or the like. By virtue of containing these components, a laminate obtained using the resultant heat curable resin composition can be further improved in various properties. For example, when the heat curable resin composition of the present invention contains an appropriate inorganic filler, a laminate obtained using the resin composition can be improved in low thermal expansion property, high modulus, heat resistance, and flame retardancy. When the heat curable resin composition contains an appropriate flame retardant, excellent flame retardancy can be imparted to a laminate obtained using the resin composition. When containing an appropriate curing accelerator, the heat curable resin composition can be improved in curing properties, so that a laminate obtained using the resin composition can be improved in high frequency properties, heat resistance, adhesion to a conductor, high modulus, and glass transition temperature. Further, when the heat curable resin composition contains an appropriate phenolic antioxidant, a laminate obtained using the resin composition can be improved in insulation reliability without sacrificing the dielectric properties and heat resistance.

With respect to the component (C) used in the heat curable resin composition of the present invention, there is no particular limitation. However, examples of the component (C) include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay, such as calcined clay, talc, aluminum borate, aluminum borate, and silicon carbide. These may be used individually or in combination. With respect to the shape and particle diameter of the inorganic filler, there is no particular limitation, but, for example, one having a particle diameter of 0.01 to 20 μm, preferably 0.1 to 10 μm is advantageously used. The term "particle diameter" used here indicates an average particle diameter, which corresponds to a particle diameter determined at a point of 50% volume in a cumulative frequency distribution curve obtained from the particle diameters when the whole volume of the particles is taken as 100%. The particle diameter can be measured by means of a particle size distribution measurement apparatus using a laser diffraction scattering method or the like.

When the component (C) is used, there is no particular limitation with respect to the amount of the component (C) used. However, for example, the content of the component (C) in the heat curable resin composition containing the component (C) is preferably 3 to 65% by volume, more preferably 5 to 60% by volume. When the content of the component (C) in the heat curable resin composition is in the above range, further excellent curing properties, formability, and chemical resistance are likely to be obtained. Further, when the component (C) is used, for the purpose of improving the dispersibility of the component (C) and the adhesion of the component (C) to the organic components in the heat curable resin composition, if necessary, a coupling agent is preferably used in combination with the component (C). With respect to the coupling agent, there is no particular limitation, and, for example, various types of silane coupling agents and titanate coupling agents can be used. These may be used individually or in combination. With respect to the amount of the coupling agent used, there is no particular limitation, and, for example, relative to 100 parts by mass of the component (C) used, the amount of the coupling agent is preferably 0.1 to 5 parts by mass, more preferably 0.5 to 3 parts by mass. When the amount of the coupling agent is in the above range, various properties are unlikely to become poor, and the above-mentioned characteristic features obtained by the use of the component (C) can be effectively exhibited. When a coupling agent is used, rather than a so-called integral blend treatment method in which the component (C) is incorporated into the resin composition and then a coupling agent is added thereto, a method of using an inorganic filler having a surface preliminarily treated with a coupling agent by a dry process or a wet process is preferred. By using such a method, the characteristic features obtained by the use of the component (C) can be more effectively exhibited.

In the present invention, when the component (C) is used, for the purpose of improving the dispersibility of the component (C) in the heat curable resin composition, if necessary, the component (C) may be used in the form of a slurry obtained by preliminarily dispersing the component (C) in an organic solvent. With respect to the organic solvent used for forming a slurry of the component (C), there is no particular limitation. However, for example, the organic solvents mentioned above as examples in connection with the above-mentioned production step for the polyphenylene ether compound (A') can be applied. These may be used individually or in combination. Of these, methyl ethyl ketone, methyl isobutyl ketone, and cyclohexanone are preferred from the viewpoint of the dispersibility. With respect to the nonvolatile content of the slurry, there is no particular limitation. However, for example, from the viewpoint of the settling property and dispersibility of the inorganic filler, the nonvolatile content of the slurry is preferably in the range of from 50 to 80% by mass, more preferably 60 to 80% by mass.

With respect to the component (D) used in the heat curable resin composition of the present invention, there is no particular limitation, but examples include chlorine, bromine, phosphorus, and metal hydrate flame retardants. From the viewpoint of the adaptability to consideration of the environment, phosphorus and metal hydrate flame retardants are more preferred.

When a phosphorus flame retardant is used, examples of phosphorus flame retardants include aromatic phosphate compounds, such as triphenyl phosphate, tricresyl phosphate, trixylenyl phosphate, cresyldiphenyl phosphate, cresyldi-2,6-xylenyl phosphate, resorcinol bis(diphenyl phosphate), 1,3-phenylenebis(di-2,6-xylenyl phosphate), bisphenol A-bis(diphenyl phosphate), and 1,3-phenylenebis(diphenyl phosphate); phosphonates, such as divinyl phenylphosphonate, diallyl phenylphosphonate, and bis(1-butenyl) phenylphosphonate; phosphinates, such as phenyl diphenylphosphinate and methyl diphenylphosphinate; phosphazene compounds, such as bis(2-allylphenoxy)phosphazene and dicresylphosphazene; 9,10-dihydro-9-oxa-10-phosphaphenanthrene-10-oxide and derivatives thereof, such as 10-(2,5-dihydroxyphenyl)-9,10-dihydro-9-oxa-10-phosphaphenanthrene-10-oxide, melamine phosphate, melamine pyrophosphate, melamine polyphosphate, melam polyphosphate, ammonium polyphosphate, phosphorus-containing vinylbenzyl compounds, metal salts of a phosphinic acid compound, and red phosphorus. These may be used individually or in combination. Of these, aromatic phosphate compounds, phosphazene compounds, phosphinates, metal salts of a phosphinic acid compound, 9,10-dihydro-9-oxa-10-phosphaphenanthrene-10-oxide, and derivatives thereof are preferably used because both various properties, such as high frequency properties, and flame retardancy can be achieved.

When the flame retardant is a phosphorus flame retardant, there is no particular limitation with respect to the amount of the phosphorus flame retardant used. However, for example, the phosphorus atom content of the heat curable resin composition (the total of the components other than the component (C)), in terms of a solids content, is preferably 0.2 to 5.0% by mass, more preferably 0.3 to 3.0% by mass. When the phosphorus atom content is 0.2% by mass or more, further excellent flame retardancy is likely to be obtained. Further, when the phosphorus atom content is 5.0% by mass or less, further excellent formability, heat resistance, glass transition temperature, and adhesion to a conductor are likely to be obtained.

As examples of metal hydrate flame retardants, there can be mentioned magnesium hydroxide and aluminum hydroxide mentioned above as examples in connection with the component (C). With respect the amount of the metal hydrate flame retardant used, the above-mentioned preferred amount of the component (C) used is applied.

When a bromine flame retardant is used, examples of bromine flame retardants include brominated epoxy resins, such as brominated bisphenol A epoxy resins and brominated phenolic novolak epoxy resins; brominated addition-type flame retardants, such as hexabromobenzene, pentabromotoluene, ethylenebis(pentabromophenyl), ethylenebistetrabromophthalimide, 1,2-dibromo-4-(1,2-dibromoethyp)cyclohexane, tetrabromocyclooctane, hexabromocyclododecane, bis(tribromophenoxy)ethane, brominated polyphenylene ether, brominated polystyrene, and 2,4,6-tris(tribromophenoxy)-1,3,5-triazine; and brominated reaction-type flame retardants containing an unsaturated double bond group, such as tribromophenylmaleimide, tribromophenyl acrylate, tribromophenyl methacrylate, tetrabromobisphenol A dimethacrylate, pentabromobenzyl acrylate, and brominated styrene. These may be used individually or in combination. Of these, ethylenebis(pentabromophenyl), ethylenebistatrabromophthalimide, brominated polyphenylene ether, brominated polystyrene, and 2,4,6-tris(tribromophenoxy)-1,3,5-triazine are preferably used because both excellent various properties, such as high frequency properties, heat resistance, adhesion to a conductor, and glass transition temperature, and excellent flame retardancy can be achieved.

When the flame retardant is a bromine flame retardant, there is no particular limitation with respect to the amount of the bromine flame retardant used. However, for example, the bromine atom content of the heat curable resin composition (the total of the components other than the component (C)), in terms of a solids content, is preferably 3 to 30% by mass, more preferably 5 to 25% by mass. When the bromine atom content is 3% by mass or more, excellent flame retardancy can be obtained. Further, when the bromine atom content is 30% by mass or less, excellent formability, heat resistance, glass transition temperature, and adhesion to a conductor can be obtained.

Further, the heat curable resin composition of the present invention can contain an inorganic flame retardant auxiliary, such as antimony trioxide or zinc molybdate. When an inorganic flame retardant auxiliary is used, there is no particular limitation with respect to the amount of the inorganic flame retardant auxiliary used. However, for example, relative to 100 parts by mass of the heat curable resin composition (the total of the component (A) and component (B)), in terms of a solids content, the amount of the inorganic flame retardant auxiliary used is preferably 0.1 to 20 parts by mass, more preferably 0.1 to 10 parts by mass. When the inorganic flame retardant auxiliary is used in an amount in the above range, excellent chemical resistance can be obtained.

When the heat curable resin composition of the present invention contains the component (E), the component (E) appropriately selected according to the type of the component (B) used can be used. When an epoxy resin is used as the component (B), examples of the component (E) include various imidazole compounds and derivatives thereof, various tertiary amine compounds, various quaternary ammonium compounds, and various phosphorus compounds, such as triphenylphosphine. These may be used individually or in combination. Of these, various imidazole compounds and derivatives thereof and various phosphorus compounds are preferably used from the viewpoint of the heat resistance, glass transition temperature, storage stability, and the like.

When a cyanate ester resin is used as the component (B), examples of the component (E) include various imidazole compounds and derivatives thereof, carboxylic acid salts of manganese, cobalt, zinc, or the like, and organometallic compounds, such as acetylacetone complexes of these transition metals. These may be used individually or in combination. Of these, organometallic compounds are preferably used from the viewpoint of the heat resistance, glass transition temperature, storage stability, and the like.

When a maleimide compound is used as the component (B), examples of the component (E) include acidic catalysts, such as p-toluenesulfonic acid; amine compounds, such as triethylamine, pyridine, and tributylamine; imidazole compounds, such as methylimidazole and phenylimidazole; tertiary amine compounds; quaternary ammonium compounds; phosphorus compounds, such as triphenylphosphine; and organic peroxides, such as dicumyl peroxide, 2,5-dimethyl-2,5-bis(t-butylperoxy)hexyne-3,2,5-dimethyl-2,5-bis(t-butylperoxy)hexane, and α,α'-bis(t-butylperoxy)diisopropylbenzene. These may be used individually or in combination. Of these, imidazole compounds and organic peroxides are preferably used from the viewpoint of the heat resistance, glass transition temperature, and storage stability, and an imidazole compound and an organic peroxide are especially preferably used in combination because it is possible to further improve the heat resistance, glass transition temperature, high modulus, and low thermal expansion property.

When the heat curable resin composition of the present invention contains the component (E), there is no particular limitation with respect to the amount of the component (E) used. However, for example, relative to 100 parts by mass of the total of the component (A) of the present invention and the component (B) (in terms of a solids content), the amount of the component (E) used is preferably 0.01 to 10 parts by mass, more preferably 0.01 to 5 parts by mass. When the component (E) is used in an amount in the above range, further excellent heat resistance and storage stability are likely to be obtained.

With respect to the phenolic antioxidant used as the component (F) in the heat curable resin composition of the present invention, there is no particular limitation. However, examples of phenolic antioxidants include pyrogallol, butylated hydroxyanisole, 2,6-di-tert-butyl-4-methylphenol, 2,2'-methylenebis-(4-methyl-6-tert-butylphenol), 4,4'-butylidenebis-(3-methyl-6-tert-butylphenol), 1,3,5-tris[[3,5-bis(1,1-dimethylethyl)-4-hydroxyphenyl]methyl]-1,3,5-triazine-2,4,6(1H,3H,5H)-trione, 1,1,3-tris(2-methyl-4-hydroxy-5-tert-butylphenyl)butane, stearyl-β-(3,5-di-tert-butyl-4-hydroxyphenyl) propionate, 3,9-bis[1,1-dimethyl-2-[β-(3-tert-butyl-4-hydroxy-5-methylphenyl)propionyloxy]ethyl]2,4,8,10-tetraoxaspiro[5.5]undecane, and 1,3,5-trimethyl-2,4,6-tris(3,5-di-tert-butyl-4-hydroxybenzyl)benzene. These may be used individually or in combination. Of these, 4,4'-butylidenebis-(3-methyl-6-tert-butylphenol), 1,3,5-tris[[3,5-bis(1,1-dimethylethyl)-4-hydroxyphenyl]methyl]-1,3,5-triazine-2,4,6(1H,3H,5H)-trione, and 1,3,5-trimethyl-2,4,6-tris(3,5-di-tert-butyl-4-hydroxybenzyl)benzene are preferably used because especially excellent effect of improving the insulation reliability is obtained.

With respect to the amount of the component (F) used, there is no particular limitation. However, for example, when the component (F) is incorporated in an amount in the range of from 0.01 to 5 parts by mass, relative to 100 parts by mass of the total of the component (A) and component (B), the insulation reliability can be effectively improved without causing the dielectric properties, heat resistance, glass transition temperature, adhesion to a metal, and the like to be poor.

In the present invention, when the heat curable resin composition containing the above-mentioned component (A), component (B), and components (C) to (F) incorporated if necessary is cured, the resultant cured material preferably has a glass transition temperature of 200° C. or higher. When the glass transition temperature of the cured material is 200° C. or higher, excellent resistance to soldering heat (soldering heat resistance), through-hole connection reliability, and excellent processability upon producing electronic parts and the like can be obtained.

The heat curable resin composition of the present invention can contain arbitrarily, if necessary, a resin material, such as a known thermoplastic resin or elastomer, or an additive, such as a coupling agent, an antioxidant, a heat stabilizer, an antistatic agent, an ultraviolet light absorber, a pigment, a colorant, or a lubricant. With respect to the amount of the resin material or additive used, there is no particular limitation.

The heat curable resin composition and resin varnish of the present invention can be obtained by mixing together the component (A), the component (B), the components (C) to (F) used if necessary, various additives, and, if necessary, an organic solvent by a known method, and dissolving or dispersing the components while stirring. In this instance, conditions, such as the order of mixing, and the temperature and time for mixing and stirring, are not particularly limited and can be arbitrarily set.

The resin varnish of the present invention uses the heat curable resin composition of the present invention and an organic solvent, and is obtained by dissolving or dispersing the heat curable resin composition in the organic solvent. When the resin varnish is prepared, if necessary, the organic solvent can be removed or further added according to the application working properties (varnish viscosity and varnish concentration) suitable for producing a prepreg. With respect to the organic solvent if necessary used when producing the resin varnish or further added, there is no particular limitation. However, the organic solvents mentioned above as examples in connection with the production of the polyphenylene ether compound (A') can be applied. These may be used individually or in combination.

In the present specification, the "resin varnish" and the "resin composition containing an organic solvent" have the same meaning in respect of the composition.

When the resin varnish is prepared, the solids content (nonvolatile content) of the varnish can be set according to the application working properties as mentioned above. However, it is preferred that the amount of the organic solvent used is controlled so that, for example, the solids content (nonvolatile content) of the resin varnish becomes in the range of from 30 to 80% by mass. When using the resin varnish having a solids content in the above range, the impregnation of a substrate with the resin varnish and the appearance of a prepreg produced using the resin varnish are excellent, and further the production of a prepreg having a desired thickness (the below-mentioned resin content of the prepreg) is facilitated.

The prepreg of the present invention is obtained by applying the heat curable resin composition (resin varnish) of the present invention to a sheet-form fiber reinforced substrate, and drying the applied resin composition or varnish. With respect to the drying conditions, the applied resin composition or varnish is dried by heating in a drying oven generally at a temperature of 80 to 200° C. for 1 to 30 minutes to semi-cure the resin (into a B-stage), producing the prepreg of the present invention. In this instance, the resin composition or varnish is preferably applied so that the amount of the heat curable resin composition of the present invention deposited on the substrate becomes 30 to 90% by mass, in terms of a resin content of the prepreg after being dried. When the resin content of the dried prepreg is in the above range, a laminate obtained using the resultant prepreg can achieve excellent formability.

As a sheet-form fiber reinforced substrate for the prepreg, a known substrate used in a laminate for various electrically insulating materials is used. Examples of materials for the substrate include inorganic fibers, such as E glass, NE glass, S glass, and Q glass, and organic fibers, such as polyimide, polyester, and tetrafluoroethylene, and those having a form of woven fabric, nonwoven fabric, chopped strand mat, or the like can be used. With respect to the thickness of the sheet-form fiber reinforced substrate, there is no particular limitation, and, for example, the substrate having a thickness of about 0.02 to 0.5 mm can be used. Further, the substrate having a surface treated with a coupling agent or the like or mechanically opening treated substrate can be preferably used from the viewpoint of the impregnation of the substrate with the resin varnish, and the heat resistance, moisture absorption resistance, and processability of a laminate obtained using the substrate.

The laminate of the present invention is obtained by stacking one sheet or more of the prepreg of the present invention, and disposing a metal foil or foils on one side or both sides of the stacked material, and subjecting the resultant material to hot pressing. Examples of metal foils include a copper foil and an aluminum foil. With respect to the conditions for hot pressing, there is no particular limitation, but, for example, hot pressing can be performed under conditions such that the temperature is in the range of from 100 to 300° C., the pressure is in the range of from 0.2 to 10.0 MPa, and the time is in the range of from 0.1 to 5 hours. Further, hot pressing is preferably conducted while maintaining the state in a vacuum using a vacuum press or the like for 0.5 to 5 hours.

The multilayer printed wiring board of the present invention is formed using the prepreg or metal-clad laminate of the present invention. The multilayer printed wiring board of the present invention can be produced using the prepreg or metal-clad laminate of the present invention by performing circuit formation processing and bonding processing for forming a multilayer by perforating, metal plating, etching for a metal foil, or the like according to a known method.

Hereinabove, the preferred embodiments of the present invention were described, but these embodiments are examples used for describing the present invention, and these embodiments should not be construed as limiting the scope of the present invention. The present invention can be practiced in various modes different from the above-described embodiments as long as the polyphenylene ether derivative and the like of the present invention can be obtained.

EXAMPLES

Hereinbelow, the present invention will be described in detail with reference to the following Examples, which should not be construed as limiting the scope of the present invention.

Production of Polyphenylene Ether Derivative (A)

In accordance with the procedure described below and the formulation shown in Table 1, a polyphenylene ether derivative (A) having an N-substituted maleimide group in a molecule was produced.

Production Example A-1

Production of Polyphenylene Ether Derivative (A-1)

Toluene, polyphenylene ether having a number average molecular weight of about 16,000, and p-aminophenol were charged into a glass flask container having a capacity of 2 liters and being equipped with a thermometer, a reflux condenser, and a stirrer and being capable of heating and cooling the contents of the flaks, and the temperature in the flask was set at 90° C., and the solid material was dissolved while maintaining the temperature at 90° C. and stirring. After confirming the dissolution visually, t-butylperoxyisopropyl monocarbonate and manganese naphthenate were added to the resultant solution to perform a reaction at a solution temperature of 90° C. for 4 hours, followed by cooling to 70° C., obtaining a polyphenylene ether compound (A') having a primary amino group at the end of the molecule. A small portion of the resultant reaction solution was taken and subjected to measurement of gel permeation chromatography (GPC). As a result, it was found that the peak derived from p-aminophenol disappeared and the polyphenylene ether compound had a number average molecular weight of about 9,200. Further, another small portion of the reaction solution was taken and dropwise added to a methanol/benzene mixed solvent (mass ratio in the mixed solvent: 1:1) to cause reprecipitation, and the resultant purified solid material (reaction product) was subjected to FT-IR measurement. The result of the FT-IR measurement confirmed that a peak derived from a primary amino group appeared around 3,400 cm$^{-1}$.

The number average molecular weight was measured by gel permeation chromatography (GPC) in which standard polystyrenes were used for obtaining a molecular weight conversion calibration curve. The calibration curve was obtained using standard polystyrenes: TSK standard POLYSTYRENE (Type; A-2500, A-5000, F-1, F-2, F-4, F-10, F-20, F-40) [trade name, manufactured by Tosoh Corp.]) and approximated to a cubic equation. Conditions for GPC are shown below.

Apparatus: (Pump: L-6200 Model [manufactured by Hitachi High-Technologies Corporation]),
(Detector: L-3300 Model RI [manufactured by Hitachi High-Technologies Corporation]),
(Column oven: L-655A-52 [manufactured by Hitachi High-Technologies Corporation])
Column: Guard column; TSK Guard column HHR-L+Column; TSK gel-G4000HHR+TSK gel-G2000HHR (trade name, each of which is manufactured by Tosoh Corp.)
Column size: 6.0×40 mm (guard column), 7.8×300 mm (column)
Eluent: Tetrahydrofuran
Concentration of a sample: 30 mg/5 mL
Amount of a sample per injection: 20 μL
Flow rate: 1.00 mL/minute
Temperature for measurement: 40° C.

Then, bis(4-maleimidophenyl)methane and propylene glycol monomethyl ether were added to the above-obtained reaction solution, and the temperature of the resultant mixture was increased while stirring, and, while maintaining the temperature at 120° C., a reaction was conducted for 4 hours, followed by cooling and 200-mesh filtration, to produce a polyphenylene ether derivative (A-1). A small portion of the resultant reaction solution was taken and subjected to reprecipitation in the same manner as mentioned above, and the resultant purified solid material was subjected to FT-IR measurement. The result of the FT-IR measurement confirmed that the peak at around 3,400 cm$^{-1}$ derived from a primary amino group disappeared and a peak of a carbonyl group of maleimide appeared at 1,700 to 1,730 cm$^{-1}$. Further, the solid material was subjected to GPC measurement (under the same conditions as mentioned above). As a result, the number average molecular weight was found to be about 9,400.

Production Example A-2

Production of Polyphenylene Ether Derivative (A-2)

A polyphenylene ether derivative (A-2) in Production Example A-2 was produced in the same manner as in Production Example A-1 except that, instead of bis(4-maleimidophenyl) methane, 3,3'-dimethyl-5,5'-diethyl-4,4'-diphenylmethanebismaleimide was used, and the individual components with the formulation shown in Table 1 were used. The polyphenylene ether derivative (A-2) had a number average molecular weight of about 9,400.

Production Example A-3

Production of Polyphenylene Ether Derivative (A-3)

A polyphenylene ether derivative (A-3) in Production Example A-3 was produced in the same manner as in Production Example A-1 except that, instead of bis(4-maleimidophenyl) methane, 2,2-bis(4-(4-maleimidophenoxy)phenyl)propane was used, and the individual components with the formulation shown in Table 1 were used. The polyphenylene ether derivative (A-3) had a number average molecular weight of about 9,500.

Production Example A-4

Production of Polyphenylene Ether Derivative (A-4)

A polyphenylene ether derivative (A-4) in Production Example A-4 was produced in the same manner as in Production Example A-1 except that, instead of bis(4-maleimidophenyl)methane, polyphenylmethanemaleimide was used, and the individual components with the formulation shown in Table 1 were used. The polyphenylene ether derivative (A-4) had a number average molecular weight of about 9,400.

Production Example A-5

Production of Polyphenylene Ether Derivative (A-5)

A polyphenylene ether derivative (A-5) in Production Example A-5 was produced in the same manner as in Production Example A-1 except that, instead of bis(4-maleimidophenyl) methane, 1,6-bismaleimido-(2,2,4-trimethyl)hexane was used, and the individual components with the formulation shown in Table 1 were used. The polyphenylene ether derivative (A-5) had a number average molecular weight of about 9,300.

Production Example A-6

Production of Polyphenylene Ether Derivative (A-6)

A polyphenylene ether derivative (A-6) in Production Example A-6 was produced in the same manner as in Production Example A-1 except that, instead of p-aminophenol, m-aminophenol was used. The polyphenylene ether derivative (A-6) had a number average molecular weight of about 9,400.

Production Example A-7

Production of Polyphenylene Ether Derivative (A-7)

A polyphenylene ether derivative (A-7) in Production Example A-7 was produced in the same manner as in Production Example A-3 except that p-aminophenol and 2,2-bis(4-(4-maleimidophenoxy)phenyl)propane and the like were used, and the individual components with the formulation shown in Table 1 were used. The polyphenylene ether derivative (A-7) had a number average molecular weight of about 4,000.

Production Example A-8

Production of Polyphenylene Ether Derivative (A-8)

A polyphenylene ether derivative (A-8) in Production Example A-8 was produced in the same manner as in Production Example A-3 except that p-aminophenol and 2,2-bis(4-(4-maleimidophenoxy)phenyl)propane and the like were used, and the individual components with the formulation shown in Table 1 were used. The polyphenylene ether derivative (A-8) had a number average molecular weight of about 5,000.

Production Example A-9

Production of Polyphenylene Ether Derivative (A-9)

A polyphenylene ether derivative (A-9) in Production Example A-9 was produced in the same manner as in Production Example A-3 except that p-aminophenol and 2,2-bis(4-(4-maleimidophenoxy)phenyl)propane and the like were used, and the individual components with the formulation shown in Table 1 were used. The polyphenylene ether derivative (A-9) had a number average molecular weight of about 12,000.

Production Example A-10

Production of Polyphenylene Ether Derivative (A-10)

A polyphenylene ether derivative (A-10) in Production Example A-10 was produced in the same manner as in Production Example A-3 except that p-aminophenol and 2,2-bis(4-(4-maleimidophenoxy)phenyl)propane and the like were used, and the individual components with the formulation shown in Table 1 were used. The polyphenylene ether derivative (A-10) had a number average molecular weight of about 13,000.

[Production of Low-molecular-weight Polyphenylene Ether]

In accordance with the procedure described below and the formulations shown in Table 1, low-molecular-weight polyphenylene ethers (R-1 and R-2) as materials for comparison were produced.

Comparative Production Example R-1

Production of Low-molecular-weight Polyphenylene Ether (R-1)

Toluene, polyphenylene ether having a number average molecular weight of about 16,000, and bisphenol A were charged into a glass flask container having a capacity of 2 liters and being equipped with a thermometer, a reflux condenser, and a stirrer and being capable of heating and cooling the contents of the flaks. While maintaining the temperature of the resultant mixture at 80° C. and stirring, the solid material was dissolved. After confirming the dissolution visually, t-butylperoxyisopropyl monocarbonate and cobalt naphthenate were added to the resultant solution to perform a reaction for one hour, obtaining a low-molecular-weight polyphenylene ether (R-1). The obtained low-molecular-weight polyphenylene ether (R-1) was subjected to GPC measurement (polystyrene converted value; eluent: tetrahydrofuran). As a result, the molecular weight was found to be about 8,000.

Comparative Production Example R-2

Production of Low-molecular-weight Polyphenylene Ether (R-2)

A low-molecular-weight polyphenylene ether solution was obtained in the same manner as in Comparative Production Example R-1 except that bisphenol A was used, and the individual components with the formulation shown in Table 1 were used. A large amount of methanol was added to the obtained solution to cause low-molecular-weight polyphenylene ether to suffer reprecipitation, and then the resultant solids were dried under a reduced pressure at 80° C. for 3 hours to remove the organic solvent, obtaining a low-molecular-weight polyphenylene ether (R-2') in a solid state. Then, the obtained low-molecular-weight polyphenylene ether (R-2'), chloromethylstyrene, tetra-n-butylammonium bromide, and toluene were charged into a glass flask container having a capacity of 2 liters and being equipped with a thermometer, a reflux condenser, a stirrer, and a dropping funnel and being capable of heating and cooling the contents of the flaks. While maintaining the temperature of the resultant mixture at 75° C. and stirring, the solid material was dissolved, and then an aqueous sodium hydroxide solution was dropwise added to the resultant solution over 20 minutes, and the resultant mixture was stirred at 75° C. for another 4 hours to perform a reaction. Subsequently, the content of the flask was neutralized using a 10% aqueous solution of hydrochloric acid, and then a large amount of methanol was added to the content of the flask to cause reprecipitation, followed by filtration. The collected material was washed three times with a mixture of methanol and water in a ratio of 80:20, and then dried under a reduced pressure at 80° C. for 3 hours to obtain a low-molecular-weight polyphenylene ether (R-2) having an end ethenylbenzylated. The obtained low-molecular-weight polyphenylene ether (R-2) was subjected to GPC measurement (polystyrene converted value; eluent: tetrahydrofuran). As a result, the molecular weight was found to be about 3,000.

[Production of a Polyphenylene Ether-modified Butadiene Prepolymer]

In accordance with the procedure described below and the formulation shown in Table 1, a polyphenylene ether-modified butadiene prepolymer (R-3) as a material for comparison was produced.

Comparative Production Example R-3

Production of Polyphenylene Ether-modified Butadiene Prepolymer (R-3)

Toluene and polyphenylene ether having a number average molecular weight of about 16,000 were charged into a glass flask container having a capacity of 2 liters and being equipped with a thermometer, a reflux condenser, a vacuum evaporator, and a stirrer and being capable of heating and cooling the contents of the flaks, and the temperature in the flask was set at 90° C. and the solid material was dissolved while stirring. Then, a polybutadiene resin and bis(4-maleimidophenyl)methane were added to the resultant solution, stirred and dissolved. The temperature of the resultant solution was set at 110° C., and then 1,1-bis(t-hexylperoxy)-3,3,5-trimethylcyclohexane as a reaction initiator was added to the solution and a reaction was conducted for one hour while stirring so that the butadiene resin and bismaleimide underwent a preliminary reaction in the presence of the polyphenylene ether. Then, the temperature of the resultant solution was set at 80° C., and then the solution was concentrated under a reduced pressure while stirring so that the solids content of the solution became 45% by mass, followed by cooling, to obtain a polyphenylene ether-modified butadiene prepolymer solution in Comparative Production Example R-3. A conversion of bis(4-maleimidophenyl) methane (value obtained by subtracting an amount of the unconverted bis(4-maleimidophenyl)methane (measured value) from 100) in the obtained polyphenylene ether-modified butadiene prepolymer (R-3) solution was measured by GPC (polystyrene converted value; eluent: tetrahydrofuran). As a result, the conversion was found to be 30%.

Production of Polyaminobismaleimide Compounds (B-1 to B-4) and Phenol-modified Cyanate Prepolymer (B-5)

In accordance with the procedure described below and the formulations shown in Table 2, polyaminobismaleimide compounds (B-1 to B-4) and a phenol-modified cyanate prepolymer (B-5) were produced.

Production Example B-1

Production of Polyaminobismaleimide Compound (B-1)

Bis(4-maleimidophenyl)methane, 4,4'-diamino-3,3'-diethyl-diphenylmethane, and propylene glycol monomethyl ether were charged into a glass flask container having a capacity of 1 liter and being equipped with a thermometer, a reflux condenser, and a stirrer and being capable of heating and cooling the contents of the flaks, and, while maintaining the temperature of the resultant mixture at 120° C. and stirring, a reaction was conducted for 3 hours, followed by cooling and 200-mesh filtration, to produce a polyaminobismaleimide compound (B-1) in Production Example B-1.

Production Example B-2

Production of Polyaminobismaleimide Compound (B-2)

A polyaminobismaleimide compound (B-2) in Production Example B-2 was produced in the same manner as in Production Example B-1 except that, instead of bis(4-maleimidophenyl)methane and 4,4'-diamino-3,3'-diethyl-diphenylmethane, 2,2-bis(4-(4-maleimidophenoxy)phenyl)propane and 2,2-bis(4-(4-aminophenoxy)phenyl)propane were used in the amounts shown in Table 2.

Production Example B-3

Production of Polyaminobismaleimide Compound (B-3)

A polyaminobismaleimide compound (B-3) in Production Example B-3 was produced in the same manner as in Production Example B-1 except that, instead of bis(4-maleimidophenyl)methane and 4,4'-diamino-3,3'-diethyl-diphenylmethane, 2,2-bis(4-(4-maleimidophenoxy)phenyl)propane and 4,4'-[1,4-phenylenebis(1-methylethylidene)]bisaniline were used in the amounts shown in Table 2.

Production Example B-4

Production of Polyaminobismaleimide Compound (B-4)

A polyaminobismaleimide compound (B-4) in Production Example B-4 was produced in the same manner as in Production Example B-1 except that, instead of bis(4-maleimidophenyl)methane and 4,4'-diamino-3,3'-diethyl-diphenylmethane, 2,2-bis(4-(4-maleimidophenoxy)phenyl)propane, 3,3'-dimethyl-5,5'-diethyl-4,4'- diphenylmethanebismaleimide, and 4,4'-[1,3-phenylenebis(1-methylethylidene)]bisaniline were used in the amounts shown in Table 2.

Production Example B-5

Production of Phenol-modified Cyanate Prepolymer (B-5)

Toluene, 2,2-bis(4-cyanatophenyl)propane, and p-(α-cumyl)phenol were charged into a glass flask container having a capacity of 1 liter and being equipped with a thermometer, a reflux condenser, and a stirrer and being capable of heating and cooling the contents of the flaks. After the dissolution of the solid material was confirmed visually, while maintaining the temperature of the resultant solution at 110° C. and stirring, zinc naphthenate as a reaction catalyst was added to the solution to perform a reaction for 3 hours, followed by cooling and 200-mesh filtration, to produce a phenol-modified cyanate prepolymer solution (B-5) in Production Example B-5.

Preparation of Heat Curable Resin Compositions (Resin Varnishes) in Preparation Examples 1 to 20 and Comparative Preparation Examples 1 to 7

Using the above-obtained polyphenylene ether derivatives in Production Examples A-1 to A-10, polyaminobismaleimide compounds in Production Examples B-1 to B-4, phenol-modified cyanate prepolymer in Production Example B-5, low-molecular-weight polyphenylene ethers in Comparative Production Examples R-1 and R-2, polyphenylene ether-modified butadiene prepolymer in Comparative Production Example R-3, and the above-mentioned general polyphenylene ether having a number average molecular weight of about 16,000, various thermosetting resins, such as an epoxy resin, a cyanate ester resin, a bismaleimide compound, and triallyl isocyanurate, an inorganic filler, a flame retardant, a curing accelerator, an organic solvent, and the like, in accordance with the formulations shown in Tables 3 to 5, the above materials were mixed together and stirred at room temperature or while heating at 50 to 80° C. to prepare heat curable resin compositions (resin varnishes) individually having a solids content (nonvolatile content) of about 40 to 60% by mass.

The resin composition (excluding the inorganic filler) generally has a density of 1.20 to 1.25 g/cm$^3$, and the inorganic filler used has a density of 2.2 to 3.01 g/cm$^3$. Therefore, when 80 parts by mass of the inorganic filler is incorporated, relative to 100 parts by mass of the resin composition, the amount of the inorganic filler incorporated is about 30 to 34% by volume.

Abbreviations for the individual materials and the like shown in Tables 1 to 5 are as follows.

(1) PPO640 (polyphenylene ether; number average molecular weight: about 16,000; trade name, manufactured by SABIC Innovative Plastics Japan LLC.)

(2) Bismaleimide compound
BMI-1000: Bis(4-maleimidophenyl)methane (trade name, manufactured by Daiwa Kasei Industry Co., Ltd.)
BMI-5100: 3,3'-Dimethyl-5,5'-diethyl-4,4'-diphenylmethanebismaleimide (trade name, manufactured by Daiwa Kasei Industry Co., Ltd.)
BMI-4000: 2,2-Bis(4-(4-maleimidophenoxy)phenyl)propane (trade name, manufactured by Daiwa Kasei Industry Co., Ltd.)
BMI-2300: Polyphenylmethanemaleimide (trade name, manufactured by Daiwa Kasei Industry Co., Ltd.)
BMI-TMH: 1,6-Bismaleimido-(2,2,4-trimethyl)hexane (trade name, manufactured by Daiwa Kasei Industry Co., Ltd.)

(3) Epoxy resin
NC-3000H: Biphenylaralkyl epoxy resin (trade name, manufactured by Nippon Kayaku Co., Ltd.)
NC-7000L: Naphthol novolak epoxy resin (trade name, manufactured by Nippon Kayaku Co., Ltd.)

(4) Cyanate ester resin
BADCY: 2,2-Bis(4-cyanatophenyl)propane (trade name, manufactured by Lonza Japan)
BA230S: 2,2-Bis(4-cyanatophenyl)propane prepolymer (solids content: 75% by mass; trade name, manufactured by Lonza Japan)

(5) Diamine compound
KAYAHARD-AA: 4,4'-Diamino-3,3'-diethyl-diphenylmethane (trade name, manufactured by Nippon Kayaku Co., Ltd.)
BAPP: 2,2-Bis(4-(4-aminophenoxy)phenyl)propane (trade name, manufactured by Wakayama Seika Kogyo Co., Ltd.)
Bisaniline-P: 4,4'-[1,4-Phenylenebis(1-methylethylidene)]bisaniline (trade name, manufactured by Mitsui Chemicals, Inc.)
Bisaniline-M: 4,4'-[1,3-Phenylenebis(1-methylethylidene)]bisaniline (trade name, manufactured by Mitsui Chemicals, Inc.)

(6) Polybutadiene resin
B-3000: Butadiene homopolymer (number average molecular weight: about 3,000; trade name, manufactured by Nippon Soda Co., Ltd.)

(7) Triallyl isocyanurate
TAIC: Triallyl isocyanurate (trade name, manufactured by Nippon Kasei Chemical Co., Ltd.)

(8) Compatibilizer
Tufprene A: Styrene-butadiene block copolymer (trade name, manufactured by Asahi Kasei Chemicals Corporation)

(9) Chloromethylstyrene
CMS: p-Chloromethylstyrene/m-chloromethylstyrene ratio=50/50 (trade name, manufactured by Tokyo Chemical Industry Co., Ltd.)

(10) Inorganic filler
SC-2050KNG: Spherical fused silica (average particle diameter: 0.5 μm; surface treatment: vinylsilane coupling agent (1% by mass/solids content); dispersing medium: methyl isobutyl ketone (MIBK); solids content: 70% by mass; density: 2.2 g/cm$^3$; trade name, manufactured by Admatechs Co., Inc.)
AlOOH: Boehmite aluminum hydroxide; density: 3.0 g/cm$^3$ (trade name, manufactured by Kawai Lime Industry Co., Ltd.)

(11) Flame retardant
HCA-HQ: 10-(2,5-Dihydroxyphenyl)-9,10-dihydro-9-oxa-10-phosphaphenanthrene-10-oxide (phosphorus content: 9.6% by mass; trade name, manufactured by Sanko Co., Ltd.)
OP-935: Aluminum dialkylphosphinate (phosphorus content: 23.5% by mass; trade name, manufactured by Clariant)
PX-200: 1,3-Phenylenebis(di-2,6-xylenyl phosphate) (aromatic condensed phosphate; phosphorus content: 9% by mass; trade name, manufactured by Daihachi Chemical Industry Co., Ltd.)

(12) Reaction catalyst and curing accelerator
PERBUTYL-I: t-Butylperoxyisopropyl monocarbonate (trade name, manufactured by NOF Corporation)
PERHEXA TMH: 1,1-Bis(t-hexylperoxy)-3,3,5-trimethylcyclohexane (trade name, manufactured by NOF Corporation)
PERBUTYL-P: α,α'-Bis(t-butylperoxy)diisopropylbenzene (trade name, manufactured by NOF Corporation)

G-8009L: Isocyanate masked imidazole (trade name, manufactured by Dai-ichi Kogyo Seiyaku Co., Ltd.)

TABLE 1

| | | Production Example | | | | | | |
|---|---|---|---|---|---|---|---|---|
| Item | | A-1 | A-2 | A-3 | A-4 | A-5 | A-6 | A-7 |
| Polyphenylene ether | PPO640 | 100 | 100 | 100 | 100 | 100 | 100 | 100 |
| Phenol compound | p-Aminophenol | 1.35 | 1.35 | 1.35 | 1.35 | 1.35 | — | 4.8 |
| | m-Aminophenol | — | — | — | — | — | 1.35 | — |
| | Bisphenol A | — | — | — | — | — | — | — |
| Bismaleimide compound | BMI-1000 | 4.5 | — | — | — | — | 4.5 | — |
| | BMI-5100 | — | 5.5 | — | — | — | — | — |
| | BMI-4000 | — | — | 7.2 | — | — | — | 25 |
| | BMI-2300 | — | — | — | 6 | — | — | — |
| | BMI-TMH | — | — | — | — | 4 | — | — |
| Polybutadiene resin | B-3000 | — | — | — | — | — | — | — |
| Reaction catalyst | PERBUTYL-I | 2.0 | 2.0 | 2.0 | 2.0 | 2.0 | 2.0 | 2.0 |
| | PERHEXA TMH | — | — | — | — | — | — | — |
| | Manganese naphthenate | 0.15 | 0.15 | 0.15 | 0.15 | 0.15 | 0.15 | 0.15 |
| | Cobalt naphthenate | — | — | — | — | — | — | — |
| Organic solvent | Toluene | 190 | 190 | 190 | 190 | 190 | 190 | 200 |
| | Propylene glycol monomethyl ether | 10 | 12 | 15 | 13 | 9 | 10 | 50 |
| Low-molecular-weight polyphenylene ether | (R-2') | — | — | — | — | — | — | — |
| Vinylbenzyl compound | CMS | — | — | — | — | — | — | — |
| Phase transfer catalyst | Tetra-n-butylammonium bromide | — | — | — | — | — | — | — |
| Metal hydroxide | 50% Aqueous NaOH solution | — | — | — | — | — | — | — |
| Organic solvent | Toluene | — | — | — | — | — | — | — |

| | | Production Example | | | Comparative Production Example | | |
|---|---|---|---|---|---|---|---|
| Item | | A-8 | A-9 | A-10 | R-1 | R-2 | R-3 |
| Polyphenylene ether | PPO640 | 100 | 100 | 100 | 100 | 100 | 100 |
| Phenol compound | p-Aminophenol | 3.8 | 0.8 | 0.65 | — | — | — |
| | m-Aminophenol | — | — | — | — | — | — |
| | Bisphenol A | — | — | — | 1.0 | 3.8 | — |
| Bismaleimide compound | BMI-1000 | — | — | — | — | — | 60 |
| | BMI-5100 | — | — | — | — | — | — |
| | BMI-4000 | 20 | 4.3 | 3.5 | — | — | — |
| | BMI-2300 | — | — | — | — | — | — |
| | BMI-TMH | — | — | — | — | — | — |
| Polybutadiene resin | B-3000 | — | — | — | — | — | 200 |
| Reaction catalyst | PERBUTYL-I | 2.0 | 2.0 | 2.0 | 0.9 | 2.9 | — |
| | PERHEXA TMH | — | — | — | — | — | 1.0 |
| | Manganese naphthenate | 0.15 | 0.15 | 0.15 | — | — | — |
| | Cobalt naphthenate | — | — | — | 0.027 | 0.0027 | — |
| Organic solvent | Toluene | 200 | 200 | 200 | 305 | 250 | 850 |
| | Propylene glycol monomethyl ether | 40 | 8 | 6 | — | — | — |
| Low-molecular-weight polyphenylene ether | (R-2') | — | — | — | — | 100 | — |
| Vinylbenzyl compound | CMS | — | — | — | — | 7.25 | — |
| Phase transfer catalyst | Tetra-n-butylammonium bromide | — | — | — | — | 0.4 | — |
| Metal hydroxide | 50% Aqueous NaOH solution | — | — | — | — | 11 | — |
| Organic solvent | Toluene | — | — | — | — | 200 | — |

(Unit for the amount is part(s) by mass.)

TABLE 2

| Item | | Production Example | | | | |
|---|---|---|---|---|---|---|
| | | B-1 | B-2 | B-3 | B-4 | B-5 |
| Bismaleimide compound (a) | BMI-1000 | 100 | — | — | — | — |
| | BMI-4000 | — | 100 | 100 | 50 | — |
| | BMI-5100 | — | — | — | 50 | — |
| Diamine compound (b) | KAYAHARD-AA | 14 | — | — | — | — |
| | BAPP | — | 15 | — | — | — |
| | Bisaniline-P | — | — | 12 | — | — |
| | Bisaniline-M | — | — | — | 14 | — |
| Cyanate ester resin | BADCY | — | — | — | — | 100 |
| Phenol compound | p-(α-Cumyl)phenol | — | — | — | — | 1.55 |
| Reaction catalyst | Zinc naphthenate | — | — | — | — | 0.03 |
| Organic solvent | Toluene | — | — | — | — | 44 |
| | Propylene glycol monomethyl ether | 50 | 50 | 48 | 50 | — |

(Unit for the amount is part(s) by mass.)

TABLE 3

| Item | | Preparation Example | | | | | | | | | |
|---|---|---|---|---|---|---|---|---|---|---|---|
| | | 1 | 2 | 3 | 4 | 5 | 6 | 7 | 8 | 9 | 10 |
| Polyphenylene ether derivative (A) | (A-1) (solids content: 35% by mass) | 100 | 100 | 100 | 100 | — | — | — | — | — | — |
| | (A-2) (solids content: 35% by mass) | — | — | — | — | 100 | — | — | — | — | — |
| | (A-3) (solids content: 35% by mass) | — | — | — | — | — | 100 | — | — | — | — |
| | (A-4) (solids content: 35% by mass) | — | — | — | — | — | — | 100 | — | — | — |
| | (A-5) (solids content: 35% by mass) | — | — | — | — | — | — | — | 100 | — | — |
| | (A-6) (solids content: 35% by mass) | — | — | — | — | — | — | — | — | 100 | — |
| | (A-7) (solids content: 35% by mass) | — | — | — | — | — | — | — | — | — | 100 |
| | (A-8) (solids content: 35% by mass) | — | — | — | — | — | — | — | — | — | — |
| | (A-9) (solids content: 35% by mass) | — | — | — | — | — | — | — | — | — | — |
| | (A-10) (solids content: 35% by mass) | — | — | — | — | — | — | — | — | — | — |
| Thermosetting resin (B) | BMI-4000 | 35 | 25 | — | — | — | — | — | — | — | — |
| | NC-3000H | — | — | — | — | — | — | 15 | — | — | — |
| | NC-7000L | — | — | — | — | — | — | — | 10 | — | — |
| | BA-230S (solids content: 75% by mass) | — | — | — | — | — | — | — | — | 30 | — |
| | (B-1) (solids content: 70% by mass) | — | — | 50 | — | — | — | — | — | — | 50 |
| | (B-2) (solids content: 70% by mass) | — | — | — | 50 | — | — | — | — | — | — |
| | (B-3) (solids content: 70% by mass) | — | — | — | — | 50 | — | — | — | — | — |
| | (B-4) (solids content: 70% by mass) | — | — | — | — | — | 50 | — | — | — | — |
| | (B-5) (solids content: 70% by mass) | — | — | — | — | — | — | — | 20 | — | — |
| Inorganic filler (C) | SC-2050KNG (solids content: 70% by mass) | — | 35 | — | 90 | 90 | 90 | 85 | 80 | 80 | 90 |
| | AlOOH | — | 25 | 60 | — | — | — | — | — | — | — |
| Flame retardant (D) | OP-935 | — | — | — | 6 | 6 | 6 | 5 | 6 | 8 | 6 |
| | HCA-HQ | — | — | — | 5 | 5 | — | 4 | 2 | — | — |
| | PX-200 | — | — | — | — | — | 5 | — | — | — | 5 |
| Curing accelerator (E) | PERBUTYL-P | 0.7 | 0.6 | 0.7 | 0.7 | 0.7 | 0.7 | — | 0.1 | — | 0.7 |
| | G-8009L (solids content: 50% by mass) | 0.7 | 0.6 | 0.7 | 0.7 | 0.7 | 0.7 | 0.3 | 0.005 | 0.007 | 0.7 |
| | Zinc naphthenate | — | — | — | — | — | — | — | — | — | — |
| Organic solvent | Methyl ethyl ketone | — | 15 | 30 | 20 | 20 | 20 | 15 | 15 | 15 | 15 |
| | Cyclohexanone | 5 | 5 | — | — | — | — | — | — | — | — |

(Unit for the amount is part(s) by mass.)

TABLE 4

| Item | | Preparation Example | | | | | | | | | |
|---|---|---|---|---|---|---|---|---|---|---|---|
| | | 11 | 12 | 13 | 14 | 15 | 16 | 17 | 18 | 19 | 20 |
| Polyphenylene ether derivative (A) | (A-1) (solids content: 35% by mass) | — | — | — | — | — | — | — | — | 100 | 10 |
| | (A-2) (solids content: 35% by mass) | — | — | — | — | — | — | — | 50 | — | — |
| | (A-3) (solids content: 35% by mass) | — | — | — | — | — | — | — | 50 | — | — |
| | (A-4) (solids content: 35% by mass) | — | — | — | — | — | — | — | — | — | — |
| | (A-5) (solids content: 35% by mass) | — | — | — | — | — | — | — | — | — | — |
| | (A-6) (solids content: 35% by mass) | — | — | — | — | — | — | — | — | — | — |
| | (A-7) (solids content: 35% by mass) | 100 | — | — | — | — | — | — | — | — | — |
| | (A-8) (solids content: 35% by mass) | — | 100 | 100 | — | — | — | — | — | — | — |

TABLE 4-continued

|  | Item | Preparation Example | | | | | | | | | |
|---|---|---|---|---|---|---|---|---|---|---|---|
|  |  | 11 | 12 | 13 | 14 | 15 | 16 | 17 | 18 | 19 | 20 |
|  | (A-9) (solids content: 35% by mass) | — | — | — | 100 | 100 | — | — | — | — | — |
|  | (A-10) (solids content: 35% by mass) | — | — | — | — | — | 100 | 100 | — | — | — |
| Thermosetting resin (B) | BMI-4000 | — | — | — | — | — | — | — | — | — | — |
|  | NC-3000H | 15 | — | 15 | — | 15 | — | 15 | — | — | — |
|  | NC-7000L | — | — | — | — | — | — | — | — | — | — |
|  | BA-230S (solids content: 75% by mass) | — | — | — | — | — | — | — | — | — | — |
|  | (B-1) (solids content: 70% by mass) | — | 50 | — | 50 | — | 50 | — | — | — | — |
|  | (B-2) (solids content: 70% by mass) | — | — | — | — | — | — | — | — | — | — |
|  | (B-3) (solids content: 70% by mass) | — | — | — | — | — | — | — | — | — | — |
|  | (B-4) (solids content: 70% by mass) | — | — | — | — | — | — | — | 50 | — | — |
|  | (B-5) (solids content: 70% by mass) | — | — | — | — | — | — | — | — | 12.5 | 95 |
| Inorganic filler (C) | SC-2050KNG (solids content: 70% by mass) | 85 | 90 | 85 | 90 | 85 | 90 | 85 | 90 | 60 | 90 |
|  | AlOOH | — | — | — | — | — | — | — | — | — | — |
| Flame retardant (D) | OP-935 | 5 | 6 | 5 | 6 | 5 | 6 | 5 | 6 | 4 | 6 |
|  | HCA-HQ | 4 | — | 4 | — | 4 | — | 4 | 5 | — | — |
|  | PX-200 | — | 5 | — | 5 | — | 5 | — | — | 2 | 3 |
| Curing accelerator (E) | PERBUTYL-P | — | 0.7 | — | 0.7 | — | 0.7 | — | 0.7 | — | — |
|  | G-8009L (solids content: 50% by mass) | 0.3 | 0.7 | 0.3 | 0.7 | 0.3 | 0.7 | 0.3 | 0.7 | — | — |
|  | Zinc naphthenate | — | — | — | — | — | — | — | — | 0.003 | 0.02 |
| Organic solvent | Methyl ethyl ketone | 15 | 20 | 15 | 35 | 15 | 35 | 15 | 20 | 5 | 30 |
|  | Cyclohexanone | — | — | — | — | — | — | — | — | — | — |

(Unit for the amount is part(s) by mass.)

TABLE 5

|  | Item | Comparative Preparation Example | | | | | | |
|---|---|---|---|---|---|---|---|---|
|  |  | 1 | 2 | 3 | 4 | 5 | 6 | 7 |
| Polyphenylene ether | PPO640 | 35 | 35 | 35 | 35 | — | — | — |
| Low-molecular-weight polyphenylene ether | (R-1) (solids content: 25% by mass) | — | — | — | — | 100 | — | — |
|  | (R-2) | — | — | — | — | — | 70 | — |
| Polyphenylene ether-modified butadiene prepolymer | (R-3) (solids content: 45% by mass) | — | — | — | — | — | — | 100 |
| Thermosetting resin | BMI-4000 | 35 | — | — | — | — | — | — |
|  | NC-3000H | — | — | 15 | — | — | — | — |
|  | BA-230S (solids content: 75% by mass) | — | — | — | 30 | — | — | — |
|  | TAIC | — | — | — | — | 37 | 30 | — |
|  | (B-1) (solids content: 70% by mass) | — | 50 | — | — | — | — | — |
| Compatibilizer | Tufprene A | — | — | — | — | 4 | — | — |
| Inorganic filler | SC-2050KNG (solids content: 70% by mass) | — | — | 85 | 80 | 85 | 50 | 50 |
|  | AlOOH | — | 60 | — | — | — | — | — |
| Flame retardant | OP-935 | — | — | 5 | 8 | 9 | 12 | 5 |
|  | HCA-HQ | — | — | 4 | — | — | — | 4 |
| Curing accelerator | PERBUTYL-P | 0.7 | 0.7 | — | — | 2.5 | 2.5 | 1.2 |
|  | G-8009L (solids content: 50% by mass) | 0.7 | 0.7 | 0.3 | — | — | — | — |
|  | Zinc naphthenate | — | — | — | 0.007 | — | — | — |
| Organic solvent | Toluene | 70 | 70 | 70 | 70 | 30 | 100 | 20 |
|  | Methyl ethyl ketone | — | 40 | 20 | 20 | — | — | — |
|  | Cyclohexanone | 30 | — | — | — | — | — | — |

(Unit for the amount is part(s) by mass.)

[Evaluation of the Compatibility of a Heat Curable Resin Composition and a Resin Varnish]

With respect to each of the above-obtained resin varnish and the heat curable resin composition obtained after drying the resin varnish at 160° C. for 10 minutes to volatile the organic solvent, the appearance was visually examined, and the compatibility was evaluated (whether macroscopic phase separation or unevenness was present or not) in accordance with the criteria shown below. Specifically, the expression "macroscopic" indicates that visual examination can be made. The results of the evaluation as well as the results of the below-mentioned evaluation of the properties of the prepreg and copper-clad laminate are shown in Tables 6 to 8. The evaluations using the resin varnishes in Preparation Examples 1 to 20 respectively correspond to Examples 1 to 20, and the evaluations using the resin varnishes in Comparative Preparation Examples 1 to 7 respectively correspond to Comparative Examples 1 to 7.

A: Macroscopic phase separation or unevenness is not present.

B: Macroscopic phase separation or unevenness is present.

[Preparation of a Prepreg and a Copper-clad Laminate]

The resin varnish obtained in the above step was applied to glass cloth having a thickness of 0.1 mm (E glass, manufactured by Nitto Boseki Co., Ltd.), and then dried by heating at 160° C. for 7 minutes to prepare a prepreg having a resin content of about 54% by mass. 6 sheets of the prepared prepreg were stacked on one another, and low profile copper foils having a thickness of 18 μm (FV-WS, M-side Rz: 1.5 μm; manufactured by The Furukawa Electric Co., Ltd.) were disposed respectively on the top and bottom of the resultant laminate so that the M-side of each copper foil was in contact with the laminate, and subjected to hot pressing under conditions such that the temperature was 230° C. (200° C. in Comparative Preparation Examples 5 and 6), the pressure was 3.9 MPa, and the time was 180 minutes to prepare a double-sided copper-clad laminate (thickness: 0.8 mm). The prepregs and copper-clad laminates prepared using the resin varnishes in Preparation Examples 1 to 20 respectively correspond to Examples 1 to 20, and the prepregs and copper-clad laminates prepared using the resin varnishes in Comparative Preparation Examples 1 to 7 respectively correspond to Comparative Examples 1 to 7.

[Evaluation of the Appearance of a Prepreg]

The appearance of the above-obtained prepreg was examined. The appearance was visually evaluated, and a rating "B" indicates that the surface of the prepreg has any of unevenness, streak, foaming, phase separation and the like so that the appearance is uneven or poor in surface smoothness, and a rating "A" indicates that the appearance has no defect mentioned above. The results of the evaluation are shown in Tables 6 to 8.

[Evaluation of the Properties of a Copper-Clad Laminate]

With respect to the above-obtained copper-clad laminate, the formability, dielectric properties, copper foil peel strength, glass transition temperature, thermal expansion coefficient, soldering heat resistance, and flame retardancy were evaluated. The results of the evaluation are shown in Tables 6 to 8. The methods for evaluation of the properties of the copper-clad laminate are as described below.

(1) Formability

The appearance of the laminate having etched copper foils on both sides was examined to evaluate the formability. The formability was visually evaluated, and a rating "B" indicates that the laminate has any unevenness, streak, thin spot, void or the like so that the appearance is poor in evenness or surface smoothness, and a rating "A" indicates that the appearance has no defect mentioned above.

(2) Dielectric Properties

Dielectric properties (dielectric constant and dissipation factor) were measured in accordance with JPCA-TM001 (Triplate-line resonator method) at 3 GHz and 10 GHz bands.

(3) Copper Foil Peel Strength (Adhesion to a Conductor)

A copper foil peel strength was measured in accordance with JIS-C-6481.

(4) Soldering Heat Resistance

A soldering heat resistance was evaluated using a 50 mm square test specimen having etched copper foils on both sides as follows. 3 Specimens in a dry state and 3 specimens, which had been treated in a pressure cooker test (PCT) apparatus (conditions: 121° C., 2.2 atm.) for a predetermined period of time (1, 3, or 5 hours), were immersed in molten solder at 288° C. for 20 seconds, and then the appearance of each of the resultant specimens was visually examined. The figures shown in the tables mean, among the 3 specimens obtained after immersed in the solder, the number of the specimen or specimens in which a defect, such as the occurrence of blistering or measling, was not recognized in the laminate.

(5) Glass Transition Temperature (Tg) and Thermal Expansion Coefficient

A Tg and a thermal expansion coefficient (plate thicknesswise direction; temperature range: 30 to 150° C.) were measured in accordance with the IPC method by means of TMA (Q400, manufactured by TA Instruments) using a 5 mm square test specimen having etched copper foils on both sides.

(6) Flame Retardancy

Flame retardancy was measured in accordance with the Vertical Burning Method described in UL-94.

TABLE 6

| Item | | Example | | | | |
|---|---|---|---|---|---|---|
| | | 1 | 2 | 3 | 4 | 5 |
| Varnish | Compatibility (Appearance) | A | A | A | A | A |
| Resin composition | Compatibility (Appearance) | A | A | A | A | A |
| Prepreg | Appearance | A | A | A | A | A |
| Laminate | Formability (Appearance) | A | A | A | A | A |
| | Dielectric  3 GHz | 3.63 | 3.59 | 3.69 | 3.61 | 3.52 |
| | coefficient  10 GHz | 3.61 | 3.58 | 3.68 | 3.59 | 3.48 |
| | Dissipation  3 GHz | 0.0041 | 0.0034 | 0.0037 | 0.0033 | 0.0026 |
| | factor  10 GHz | 0.0064 | 0.0059 | 0.0060 | 0.0055 | 0.0049 |
| | Copper foil peel strength (kN/m) | 0.60 | 0.62 | 0.60 | 0.64 | 0.62 |
| | Soldering heat  Dry state | 3 | 3 | 3 | 3 | 3 |
| | resistance  After PCT-1 h treatment | 3 | 3 | 3 | 3 | 3 |
| | After PCT-3 h treatment | 3 | 3 | 3 | 3 | 3 |
| | After PCT-5 h treatment | 3 | 3 | 3 | 3 | 3 |
| | Tg (° C.) | 234 | 212 | 209 | 208 | 210 |
| | CTE (ppm/° C.) | 44 | 43 | 40 | 39 | 38 |
| | Flame retardancy | V-1 | V-0 | V-0 | V-0 | V-0 |

| Item | | Example | | | | |
|---|---|---|---|---|---|---|
| | | 6 | 7 | 8 | 9 | 10 |
| Varnish | Compatibility (Appearance) | A | A | A | A | A |
| Resin composition | Compatibility (Appearance) | A | A | A | A | A |
| Prepreg | Appearance | A | A | A | A | A |
| Laminate | Formability (Appearance) | A | A | A | A | A |
| | Dielectric  3 GHz | 3.56 | 3.68 | 3.54 | 3.59 | 3.63 |
| | coefficient  10 GHz | 3.53 | 3.65 | 3.52 | 3.57 | 3.61 |
| | Dissipation  3 GHz | 0.0028 | 0.0043 | 0.0038 | 0.0040 | 0.0034 |

TABLE 6-continued

|  |  |  |  |  |  |  |
|---|---|---|---|---|---|---|
| factor | 10 GHz | 0.0052 | 0.0068 | 0.0059 | 0.0060 | 0.0057 |
| Copper foil peel strength (kN/m) | | 0.68 | 0.61 | 0.60 | 0.71 | 0.62 |
| Soldering heat | Dry state | 3 | 3 | 3 | 3 | 3 |
| resistance | After PCT-1 h treatment | 3 | 3 | 3 | 3 | 3 |
|  | After PCT-3 h treatment | 3 | 3 | 3 | 3 | 3 |
|  | After PCT-5 h treatment | 3 | 3 | 3 | 3 | 3 |
| Tg (° C.) | | 214 | 200 | 207 | 210 | 206 |
| CTE (ppm/° C.) | | 39 | 45 | 40 | 41 | 39 |
| Flame retardancy | | V-0 | V-0 | V-0 | V-0 | V-0 |

TABLE 7

|  |  | Example | | | | |
|---|---|---|---|---|---|---|
| Item | | 11 | 12 | 13 | 14 | 15 |
| Varnish | Compatibility (Appearance) | A | A | A | A | A |
| Resin composition | Compatibility (Appearance) | A | A | A | A | A |
| Prepreg | Appearance | A | A | A | A | A |
| Laminate | Formability (Appearance) | A | A | A | A | A |
|  | Dielectric 3 GHz | 3.69 | 3.63 | 3.68 | 3.61 | 3.66 |
|  | coefficient 10 GHz | 3.65 | 3.60 | 3.64 | 3.57 | 3.63 |
|  | Dissipation 3 GHz | 0.0045 | 0.0035 | 0.0043 | 0.0032 | 0.0044 |
|  | factor 10 GHz | 0.0070 | 0.0056 | 0.0068 | 0.0053 | 0.0066 |
|  | Copper foil peel strength (kN/m) | 0.60 | 0.62 | 0.61 | 0.63 | 0.66 |
|  | Soldering heat Dry state | 3 | 3 | 3 | 3 | 3 |
|  | resistance After PCT-1 h treatment | 3 | 3 | 3 | 3 | 3 |
|  | After PCT-3 h treatment | 3 | 3 | 3 | 3 | 3 |
|  | After PCT-5 h treatment | 3 | 3 | 3 | 3 | 3 |
|  | Tg (° C.) | 192 | 207 | 200 | 210 | 203 |
|  | CTE (ppm/° C.) | 44 | 40 | 43 | 39 | 45 |
|  | Flame retardancy | V-0 | V-0 | V-0 | V-0 | V-0 |

|  |  | Example | | | | |
|---|---|---|---|---|---|---|
| Item | | 16 | 17 | 18 | 19 | 20 |
| Varnish | Compatibility (Appearance) | A | A | A | A | A |
| Resin composition | Compatibility (Appearance) | A | A | A | A | A |
| Prepreg | Appearance | A | A | A | A | A |
| Laminate | Formability (Appearance) | A | B | A | A | A |
|  | Dielectric 3 GHz | 3.60 | 3.66 | 3.53 | 3.43 | 3.63 |
|  | coefficient 10 GHz | 3.57 | 3.63 | 3.49 | 3.40 | 3.59 |
|  | Dissipation 3 GHz | 0.0032 | 0.0043 | 0.0027 | 0.0032 | 0.0042 |
|  | factor 10 GHz | 0.0053 | 0.0067 | 0.0050 | 0.0054 | 0.0066 |
|  | Copper foil peel strength (kN/m) | 0.62 | 0.60 | 0.66 | 0.60 | 0.70 |
|  | Soldering heat Dry state | 3 | 3 | 3 | 3 | 3 |
|  | resistance After PCT-1 h treatment | 3 | 3 | 3 | 3 | 3 |
|  | After PCT-3 h treatment | 3 | 3 | 3 | 3 | 3 |
|  | After PCT-5 h treatment | 3 | 3 | 3 | 3 | 3 |
|  | Tg (° C.) | 211 | 205 | 209 | 202 | 216 |
|  | CTE (ppm/° C.) | 41 | 45 | 39 | 44 | 40 |
|  | Flame retardancy | V-0 | V-0 | V-0 | V-0 | V-0 |

TABLE 8

|  |  | Comparative Example | | | | | | |
|---|---|---|---|---|---|---|---|---|
| Item | | 1 | 2 | 3 | 4 | 5 | 6 | 7 |
| Varnish | Compatibility (Appearance) | B | B | B | B | A | A | A |
| Resin composition | Compatibility (Appearance) | B | B | B | B | A | A | A |
| Prepreg | Appearance | B | B | B | B | A | A | A |
| Laminate | Formability (Appearance) | B | B | B | B | A | A | A |
|  | Dielectric 3 GHz | 3.72 | 3.83 | 3.84 | 3.63 | 3.67 | 3.63 | 3.48 |
|  | coefficient 10 GHz | 3.70 | 3.81 | 3.80 | 3.61 | 3.64 | 3.60 | 3.46 |
|  | Dissipation 3 GHz | 0.0057 | 0.0046 | 0.0059 | 0.0053 | 0.0065 | 0.0037 | 0.0033 |
|  | factor 10 GHz | 0.0073 | 0.0071 | 0.0086 | 0.0076 | 0.0089 | 0.0063 | 0.0059 |
|  | Copper foil peel strength (kN/m) | 0.43 | 0.48 | 0.43 | 0.48 | 0.48 | 0.53 | 0.36 |
|  | Soldering heat Dry state | 2 | 3 | 3 | 3 | 3 | 3 | 3 |

TABLE 8-continued

| | | Comparative Example | | | | | | |
|---|---|---|---|---|---|---|---|---|
| Item | | 1 | 2 | 3 | 4 | 5 | 6 | 7 |
| resistance | After PCT-1 h treatment | 0 | 3 | 3 | 3 | 3 | 3 | 3 |
| | After PCT-3 h treatment | 0 | 1 | 2 | 2 | 1 | 3 | 3 |
| | After PCT-5 h treatment | 0 | 1 | 1 | 0 | 0 | 3 | 3 |
| Tg (° C.) | | 195 | 183 | 144 | 194 | 164 | 183 | 187 |
| CTE (ppm/° C.) | | 60 | 54 | 57 | 50 | 62 | 47 | 55 |
| Flame retardancy | | Burnt | Burnt | Burnt | V-1 | Burnt | V-1 | Burnt |

As apparent from the results shown in Tables 6 and 7, in the Examples of the present invention, the compatibility of the resin varnishes and heat curable resin compositions and the appearance (evenness) of the prepregs are excellent. Further, the copper-clad laminates prepared using the above resin varnishes and the like are excellent in almost all the formability, high frequency properties (dielectric properties), adhesion to a conductor, soldering heat resistance, glass transition temperature, thermal expansion property, and flame retardancy, and have good balance between them. In Example 17, the evaluation of the formability (appearance) of the laminate is rated "B", but only slight unevenness was found in this laminate and there was no problem from a practical point of view.

On the other hand, as can be seen from Table 8, in some of the Comparative Examples, the compatibility of the resin varnishes and resin compositions and the appearance (evenness) of the prepregs are poor (Comparative Examples 1 to 4). Further, it is apparent that the copper-clad laminates in the Comparative Examples do not satisfy all of the formability, dielectric properties, adhesion to a conductor, soldering heat resistance, glass transition temperature, thermal expansion property, and flame retardancy at the same time but are poor in any of the above properties.

Next, as an experiment for checking the effect of an additive, with respect to the heat curable resin composition having added thereto a phenolic antioxidant as the component (F), the experiments described below were conducted.

Preparation Examples 21 to 36, Comparative Preparation Examples 8 to 15, Examples 21 to 36, and Comparative Examples 8 to 15

Using the above-mentioned polyphenylene ether derivatives in Production Examples A-1 to A-10, polyaminobismaleimide compounds in Production Examples B-1 to B-4, phenol-modified cyanate prepolymer in Production Example B-5, low-molecular-weight polyphenylene ethers in Comparative Production Examples R-1 and R-2, polyphenylene ether-modified butadiene prepolymer in Comparative Production Example R-3, and the above-mentioned general polyphenylene ether having a number average molecular weight of about 16,000, various thermosetting resins, such as an epoxy resin, a cyanate ester resin, a bismaleimide compound, and triallyl isocyanurate, an inorganic filler, a flame retardant, a curing accelerator, a phenolic antioxidant, an organic solvent, and the like, in accordance with the formulations shown in Tables 9 to 11, the above materials were mixed together and stirred at room temperature or while heating at 50 to 80° C. to prepare heat curable resin compositions (resin varnishes) individually having a solids content (nonvolatile content) of about 40 to 60% by mass.

The resin composition (excluding the inorganic filler) has a density of 1.20 to 1.25 g/cm$^3$, and the inorganic filler used has a density of 2.2 to 3.01 g/cm$^3$. Therefore, as for the incorporated amount of the inorganic fiber, when 80 parts by mass of the inorganic filler is incorporated relative to 100 parts by mass of the resin composition, the amount of the inorganic filler incorporated is 30 to 34% by volume.

Abbreviations for the individual materials and the like shown in Tables 9 to 11 are as mentioned above, and, in the present Preparation Examples, further, as an antioxidant, the following phenolic antioxidants are used.

(13) Phenolic Antioxidant
    AO-20: 1,3,5-Tris [[3,5-bis(1,1-dimethylethyl)-4-hydroxyphenyl]methyl]-1,3,5-triazine-2,4,6(1H,3H,5H)-trione (trade name, manufactured by ADEKA Corporation)
    AO-40: 4,4'-Butylidenebis-(3-methyl-6-tert-butylphenol) (trade name, manufactured by ADEKA Corporation)
    AO-330: 1,3,5-Trimethyl-2,4,6-tris(3,5-di-tert-butyl-4-hydroxybenzyl)benzene (trade name, manufactured by ADEKA Corporation)

TABLE 9

| | | Preparation Example | | | | | | | |
|---|---|---|---|---|---|---|---|---|---|
| | Item | 21 | 22 | 23 | 24 | 25 | 26 | 27 | 28 |
| Polyphenylene ether derivative (A) | (A-1) (solids content: 35% by mass) | 100 | 100 | 100 | 100 | — | — | — | — |
| | (A-2) (solids content: 35% by mass) | — | — | — | — | 100 | — | — | — |
| | (A-3) (solids content: 35% by mass) | — | — | — | — | — | 100 | — | — |
| | (A-4) (solids content: 35% by mass) | — | — | — | — | — | — | 100 | — |
| | (A-5) (solids content: 35% by mass) | — | — | — | — | — | — | — | 100 |
| | (A-6) (solids content: 35% by mass) | — | — | — | — | — | — | — | — |
| | (A-7) (solids content: 35% by mass) | — | — | — | — | — | — | — | — |
| | (A-8) (solids content: 35% by mass) | — | — | — | — | — | — | — | — |
| | (A-9) (solids content: 35% by mass) | — | — | — | — | — | — | — | — |
| | (A-10) (solids content: 35% by mass) | — | — | — | — | — | — | — | — |

TABLE 9-continued

| | Item | Preparation Example | | | | | | | |
|---|---|---|---|---|---|---|---|---|---|
| | | 21 | 22 | 23 | 24 | 25 | 26 | 27 | 28 |
| Thermosetting resin (B) | BMI-4000 | 35 | 25 | — | — | — | — | — | — |
| | NC-3000H | — | — | — | — | — | — | 15 | — |
| | NC-7000L | — | — | — | — | — | — | — | 10 |
| | BA-230S (solids content: 75% by mass) | — | — | — | — | — | — | — | — |
| | (B-1) (solids content: 70% by mass) | — | — | 50 | — | — | — | — | — |
| | (B-2) (solids content: 70% by mass) | — | — | — | 50 | — | — | — | — |
| | (B-3) (solids content: 70% by mass) | — | — | — | — | 50 | — | — | — |
| | (B-4) (solids content: 70% by mass) | — | — | — | — | — | 50 | — | — |
| | (B-5) (solids content: 70% by mass) | — | — | — | — | — | — | — | 20 |
| Inorganic filler (C) | SC-2050KNG (solids content: 70% by mass) | — | 35 | — | 90 | 90 | 90 | 85 | 80 |
| | AlOOH | — | 25 | 60 | — | — | — | — | — |
| Flame retardant (D) | OP-935 | — | — | — | 6 | 6 | 6 | 5 | 6 |
| | HCA-HQ | — | — | — | 5 | 5 | — | 4 | 2 |
| | PX-200 | — | — | — | — | — | 5 | — | — |
| Curing accelerator (E) | PERBUTYL-P | 0.7 | 0.6 | 0.7 | 0.7 | 0.7 | 0.7 | — | — |
| | G-8009L (solids content: 50% by mass) | 0.7 | 0.6 | 0.7 | 0.7 | 0.7 | 0.7 | 0.3 | 0.1 |
| | Zinc naphthenate | — | — | — | — | — | — | — | 0.005 |
| Antioxidant (F) | AO-20 | 0.10 | 0.09 | — | — | — | — | — | — |
| | AO-40 | — | — | 0.10 | — | 0.10 | 0.10 | — | — |
| | AO-330 | — | — | — | 0.10 | — | — | 0.08 | 0.07 |
| Organic solvent | Methyl ethyl ketone | — | 15 | 30 | 20 | 20 | 20 | 15 | 15 |
| | Cyclohexanone | 5 | 5 | — | — | — | — | — | — |

(Unit for the amount is part(s) by mass.)

TABLE 10

| | Item | Preparation Example | | | | | | | |
|---|---|---|---|---|---|---|---|---|---|
| | | 29 | 30 | 31 | 32 | 33 | 34 | 35 | 36 |
| Polyphenylene ether derivative (A) | (A-1) (solids content: 35% by mass) | — | — | — | — | — | — | 100 | 10 |
| | (A-2) (solids content: 35% by mass) | — | — | — | — | — | 50 | — | — |
| | (A-3) (solids content: 35% by mass) | — | — | — | — | — | 50 | — | — |
| | (A-4) (solids content: 35% by mass) | — | — | — | — | — | — | — | — |
| | (A-5) (solids content: 35% by mass) | — | — | — | — | — | — | — | — |
| | (A-6) (solids content: 35% by mass) | 100 | — | — | — | — | — | — | — |
| | (A-7) (solids content: 35% by mass) | — | 100 | — | — | — | — | — | — |
| | (A-8) (solids content: 35% by mass) | — | — | 100 | — | — | — | — | — |
| | (A-9) (solids content: 35% by mass) | — | — | — | 100 | — | — | — | — |
| | (A-10) (solids content: 35% by mass) | — | — | — | — | 100 | — | — | — |
| Thermosetting resin (B) | BMI-4000 | — | — | — | — | — | — | — | — |
| | NC-3000H | — | — | — | — | — | — | — | — |
| | NC-7000L | — | — | — | — | — | — | — | — |
| | BA-230S (solids content: 75% by mass) | 30 | — | — | — | — | — | — | — |
| | (B-1) (solids content: 70% by mass) | — | 50 | 50 | 50 | 50 | — | — | — |
| | (B-2) (solids content: 70% by mass) | — | — | — | — | — | — | — | — |
| | (B-3) (solids content: 70% by mass) | — | — | — | — | — | — | — | — |
| | (B-4) (solids content: 70% by mass) | — | — | — | — | — | 50 | — | — |
| | (B-5) (solids content: 70% by mass) | — | — | — | — | — | — | 12.5 | 95 |
| Inorganic filler (C) | SC-2050KNG (solids content: 70% by mass) | 80 | 90 | 90 | 90 | 90 | 90 | 60 | 90 |
| | AlOOH | — | — | — | — | — | — | — | — |
| Flame retardant (D) | OP-935 | 8 | 6 | 6 | 6 | 6 | 6 | 4 | 6 |
| | HCA-HQ | — | — | — | — | — | 5 | — | — |
| | PX-200 | — | 5 | 5 | 5 | 5 | — | 2 | 3 |
| Curing accelerator (E) | PERBUTYL-P | — | 0.7 | 0.7 | 0.7 | 0.7 | 0.7 | — | — |
| | G-8009L (solids content: 50% by mass) | — | 0.7 | 0.7 | 0.7 | 0.7 | 0.7 | — | — |
| | Zinc naphthenate | 0.007 | — | — | — | — | — | 0.003 | 0.02 |
| Antioxidant (F) | AO-20 | — | 0.10 | 0.10 | 0.10 | 0.10 | — | — | — |
| | AO-40 | — | — | — | — | — | 0.10 | — | — |
| | AO-330 | 0.08 | — | — | 0.1 | — | — | 0.08 | 0.10 |
| Organic solvent | Methyl ethyl ketone | 15 | 15 | 20 | 35 | 35 | 20 | 5 | 30 |
| | Cyclohexanone | — | — | — | — | — | — | — | — |

(Unit for the amount is part(s) by mass.)

TABLE 11

|  | Item | Comparative Preparation Example | | | | | | | |
|---|---|---|---|---|---|---|---|---|---|
|  |  | 8 | 9 | 10 | 11 | 12 | 13 | 14 | 15 |
| Polyphenylene ether | PPO640 | 35 | 35 | 35 | 35 | — | — | — | — |
| Low-molecular-weight polyphenylene ether | (R-1) (solids content: 25% by mass) | — | — | — | — | 100 | — | — | — |
|  | (R-2) | — | — | — | — | — | 70 | — | — |
| Polyphenylene ether-modified butadiene prepolymer | (R-3) (solids content: 45% by mass) | — | — | — | — | — | — | 100 | — |
| Polyphenylene ether derivative (A) | (A-1) (solids content: 35% by mass) | — | — | — | — | — | — | — | 100 |
| Thermosetting resin | BMI-4000 | 35 | — | — | — | — | — | — | — |
|  | NC-3000H | — | — | 15 | — | — | — | — | — |
|  | BA-230S (solids content: 75% by mass) | — | — | — | 30 | — | — | — | — |
|  | TAIC | — | — | — | — | 37 | 30 | — | — |
|  | (B-1) (solids content: 70% by mass) | — | 50 | — | — | — | — | — | 50 |
| Compatibilizer | Tufprene A | — | — | — | — | 4 | — | — | — |
| Inorganic filler | SC-2050KNG (solids content: 70% by mass) | — | — | 85 | 80 | 85 | 50 | 50 | — |
|  | AlOOH | — | 60 | — | — | — | — | — | 60 |
| Flame retardant | OP-935 | — | — | 5 | 8 | 9 | 12 | 5 | — |
|  | HCA-HQ | — | — | — | 4 | — | — | 4 | — |
| Curing accelerator | PERBUTYL-P | 0.7 | 0.7 | — | — | 2.5 | 2.5 | 1.2 | 0.7 |
|  | G-8009L (solids content: 50% by mass) | 0.7 | 0.7 | 0.3 | — | — | — | — | 0.7 |
|  | Zinc naphthenate | — | — | — | 0.007 | — | — | — | — |
| Organic solvent | Toluene | 70 | 70 | 70 | 70 | 30 | 100 | 20 | — |
|  | Methyl ethyl ketone | — | 40 | 20 | 20 | — | — | — | 30 |
|  | Cyclohexanone | 30 | — | — | — | — | — | — | — |

(Unit for the amount is part(s) by mass.)

Then, with respect to the obtained heat curable resin compositions and resin varnishes, the compatibility was evaluated in the same manner as mentioned above, and the results of the evaluation are shown in Tables 12 to 14. The evaluations using the resin varnishes in Preparation Examples 21 to 36 respectively correspond to Examples 21 to 36, and the evaluations using the resin varnishes in Comparative Preparation Examples 8 to 15 respectively correspond to Comparative Examples 8 to 15.

Then, using the above resin varnishes, prepregs and copper-clad laminates were prepared in the same manner as mentioned above. With respect to the obtained prepregs and copper-clad laminates, various properties were evaluated by the methods described above, and further the insulation reliability was evaluated. The evaluation of the insulation reliability was made as mentioned below. The results of the evaluation are shown in Tables 12 to 14.

(7) Insulation Reliability (Resistance to CAF)

The insulation reliability was evaluated as follows. A wiring board having a daisy chain test pattern (through-hole diameter: 0.4 mm; distance between walls of through-hole: 0.2 mm) formed by through-hole processing (perforation and copper plating) and etching for the surface copper foil was prepared, and an insulation resistance across the through-hole was measured before and after treating the wiring board by applying a voltage of 5.5 V for 500 hours under HAST conditions at a constant temperature and a high humidity (130° C./85% RH) (continuous measurement in the chamber). The figures shown in the tables indicate, among n=5 which is the number of the samples evaluated, the number of the sample or samples which had a resistance value of less than $1 \times 10^{10}$ Ω during the period of the test. The figures in parentheses mean the number of the sample or samples which had a resistance value of less than $1 \times 10^{5}$ Ω or suffered short-circuiting among the samples which had a resistance value of less than $1 \times 10^{10}$ Ω.

TABLE 12

|  | Item | Example | | | | | | | |
|---|---|---|---|---|---|---|---|---|---|
|  |  | 21 | 22 | 23 | 24 | 25 | 26 | 27 | 28 |
| Varnish | Compatibility (Appearance) | A | A | A | A | A | A | A | A |
| Resin composition | Compatibility (Appearance) | A | A | A | A | A | A | A | A |
| Prepreg | Appearance | A | A | A | A | A | A | A | A |
| Laminate | Formability (Appearance) | A | A | A | A | A | A | A | A |
|  | Dielectric coefficient 3 GHz | 3.63 | 3.59 | 3.68 | 3.62 | 3.52 | 3.56 | 3.68 | 3.55 |
|  | 10 GHz | 3.61 | 3.58 | 3.68 | 3.60 | 3.49 | 3.53 | 3.66 | 3.53 |
|  | Dissipation factor 3 GHz | 0.0042 | 0.0037 | 0.0037 | 0.0032 | 0.0027 | 0.0028 | 0.0044 | 0.0038 |
|  | 10 GHz | 0.0064 | 0.0058 | 0.0060 | 0.0055 | 0.0049 | 0.0052 | 0.0067 | 0.0059 |
|  | Copper foil peel strength (kN/m) | 0.61 | 0.61 | 0.59 | 0.66 | 0.62 | 0.68 | 0.61 | 0.62 |
|  | Soldering heat resistance Dry state | 3 | 3 | 3 | 3 | 3 | 3 | 3 | 3 |
|  | After PCT-1 h treatment | 3 | 3 | 3 | 3 | 3 | 3 | 3 | 3 |
|  | After PCT-3 h treatment | 3 | 3 | 3 | 3 | 3 | 3 | 3 | 3 |
|  | After PCT-5 h treatment | 3 | 3 | 3 | 3 | 3 | 3 | 3 | 3 |
|  | Tg (° C.) | 232 | 212 | 210 | 208 | 212 | 215 | 201 | 208 |
|  | CTE (ppm/° C.) | 45 | 44 | 39 | 39 | 38 | 39 | 45 | 40 |

TABLE 12-continued

|  | | Example | | | | | | | |
|---|---|---|---|---|---|---|---|---|---|
| Item | | 21 | 22 | 23 | 24 | 25 | 26 | 27 | 28 |
| Flame retardancy | | V-1 | V-0 | V-0 | V-0 | V-0 | V-0 | V-0 | V-0 |
| Insulation reliability | | 0 | 0 | 0 | 0 | 0 | 0 | 0 | 0 |

TABLE 13

|  | | | Example | | | | | | | |
|---|---|---|---|---|---|---|---|---|---|---|
| | Item | | 29 | 30 | 31 | 32 | 33 | 34 | 35 | 36 |
| Varnish | Compatibility (Appearance) | | A | A | A | A | A | A | A | A |
| Resin composition | Compatibility (Appearance) | | A | A | A | A | A | A | A | A |
| Prepreg | Appearance | | A | A | A | A | A | A | A | A |
| Laminate | Formability (Appearance) | | A | A | A | A | A | A | A | A |
| | Dielectric coefficient | 3 GHz | 3.59 | 3.63 | 3.62 | 3.61 | 3.60 | 3.53 | 3.45 | 3.64 |
| | | 10 GHz | 3.56 | 3.61 | 3.59 | 3.56 | 3.57 | 3.50 | 3.41 | 3.59 |
| | Dissipation factor | 3 GHz | 0.0040 | 0.0033 | 0.0034 | 0.0031 | 0.0030 | 0.0027 | 0.0032 | 0.0040 |
| | | 10 GHz | 0.0059 | 0.0057 | 0.0056 | 0.0054 | 0.0053 | 0.0050 | 0.0055 | 0.0065 |
| | Copper foil peel strength (kN/m) | | 0.70 | 0.62 | 0.62 | 0.63 | 0.62 | 0.63 | 0.60 | 0.71 |
| | Soldering heat resistance | Dry state | 3 | 3 | 3 | 3 | 3 | 3 | 3 | 3 |
| | | After PCT-1 h treatment | 3 | 3 | 3 | 3 | 3 | 3 | 3 | 3 |
| | | After PCT-3 h treatment | 3 | 3 | 3 | 3 | 3 | 3 | 3 | 3 |
| | | After PCT-5 h treatment | 3 | 3 | 3 | 3 | 3 | 3 | 3 | 3 |
| | Tg (° C.) | | 208 | 206 | 207 | 211 | 210 | 206 | 204 | 216 |
| | CTE (ppm/° C.) | | 40 | 39 | 40 | 39 | 41 | 39 | 42 | 40 |
| | Flame retardancy | | V-0 | V-0 | V-0 | V-0 | V-0 | V-0 | V-0 | V-0 |
| | Insulation reliability | | 0 | 0 | 0 | 0 | 0 | 0 | 0 | 0 |

TABLE 14

|  | | | Comparative Example | | | | | | | |
|---|---|---|---|---|---|---|---|---|---|---|
| | Item | | 8 | 9 | 10 | 11 | 12 | 13 | 14 | 15 |
| Varnish | Compatibility (Appearance) | | B | B | B | B | A | A | A | A |
| Resin composition | Compatibility (Appearance) | | B | B | B | B | A | A | A | A |
| Prepreg | Appearance | | B | B | B | B | A | A | A | A |
| Laminate | Formability (Appearance) | | B | B | B | B | A | A | A | A |
| | Dielectric coefficient | 3 GHz | 3.72 | 3.83 | 3.84 | 3.63 | 3.67 | 3.63 | 3.48 | 3.70 |
| | | 10 GHz | 3.70 | 3.81 | 3.80 | 3.61 | 3.64 | 3.60 | 3.46 | 3.67 |
| | Dissipation factor | 3 GHz | 0.0057 | 0.0046 | 0.0059 | 0.0053 | 0.0065 | 0.0037 | 0.0033 | 0.0036 |
| | | 10 GHz | 0.0073 | 0.0071 | 0.0086 | 0.0076 | 0.0089 | 0.0063 | 0.0059 | 0.0059 |
| | Copper foil peel strength (kN/m) | | 0.43 | 0.48 | 0.43 | 0.48 | 0.48 | 0.53 | 0.36 | 0.62 |
| | Soldering heat resistance | Dry state | 2 | 3 | 3 | 3 | 3 | 3 | 3 | 3 |
| | | After PCT-1 h treatment | 0 | 3 | 3 | 3 | 3 | 3 | 3 | 3 |
| | | After PCT-3 h treatment | 0 | 1 | 2 | 2 | 1 | 3 | 3 | 3 |
| | | After PCT-5 h treatment | 0 | 1 | 1 | 0 | 0 | 3 | 3 | 3 |
| | Tg (° C.) | | 195 | 183 | 144 | 194 | 164 | 183 | 187 | 210 |
| | CTE (ppm/° C.) | | 60 | 54 | 57 | 50 | 62 | 47 | 55 | 41 |
| | Flame retardancy | | Burnt | Burnt | Burnt | V-1 | Burnt | V-1 | Burnt | V-0 |
| | Insulation reliability | | 5(0) | 3(0) | 5(4) | 5(5) | 5(4) | 5(4) | 4(0) | 2(0) |

As apparent from the results shown in Tables 12 to 14, in the case of containing the phenolic antioxidant in the present invention, the compatibility of the resin varnishes and resin compositions and the appearance (evenness) of the prepregs are excellent like in the case of containing no phenolic antioxidant, and the copper-clad laminates prepared using the above resin varnishes and the like are excellent in all the formability, high frequency properties (dielectric properties), adhesion to a conductor, soldering heat resistance, glass transition temperature, thermal expansion property, and flame retardancy, and have good balance between them, and further have excellent insulation reliability. That is, it is apparent that the incorporation of the phenolic antioxidant is effective especially in improving the insulation reliability.

INDUSTRIAL APPLICABILITY

By using the polyphenylene ether derivative having a specific structure of the present invention, there can be obtained a heat curable resin composition having excellent compatibility, and particularly having high frequency properties (low dielectric constant and low dissipation factor), high adhesion to a conductor, excellent heat resistance, low thermal expansion property, high flame retardancy with a rationg V-1 or higher, and high glass transition temperature. Further, the heat curable resin composition is advantageous not only in that the cost for the raw materials and the production cost for the substrate material can be suppressed, but also in that the working environment is excellent. Therefore, a resin varnish, a prepreg, and a laminate which are provided using the heat curable resin composition can be advantageously used in electronic parts applications, such as a multilayer printed wiring board.

The invention claimed is:

1. A polyphenylene ether derivative (A) having at least one N-substituted maleimide group represented by the following general formula (I) in a molecule:

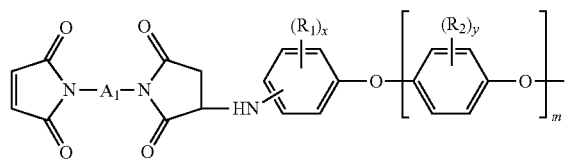

(I)

wherein $R_1$ each independently represents a hydrogen atom, an aliphatic hydrocarbon group having 1 to 5 carbon atoms, or a halogen atom, $R_2$ each independently represents a hydrogen atom, an aliphatic hydrocarbon group having 1 to 5 carbon atoms, or a halogen atom, $A_1$ represents a residual group represented by one of the following general formulas (II), (III), (IV), or (V), m is an integer of 1 or more as the number of the structural unit, and x and y are each an integer of 1 to 4,

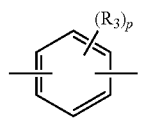

(II)

wherein $R_3$ each independently represents a hydrogen atom, an aliphatic hydrocarbon group having 1 to 5 carbon atoms, or a halogen atom, and p is an integer of 1 to 4,

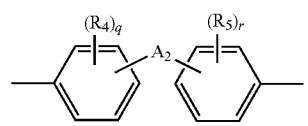

(III)

wherein $R_4$ and $R_5$ each independently represents a hydrogen atom, an aliphatic hydrocarbon group having 1 to 5 carbon atoms, or a halogen atom, $A_2$ represents an alkylene group or alkylidene group having 1 to 5 carbon atoms, an ether group, a sulfide group, a sulfonyl group, a carbonyloxy group, a ketone group, a single bond, or a residual group represented by the following general formula (III-1), and q and r are each an integer of 1 to 4,

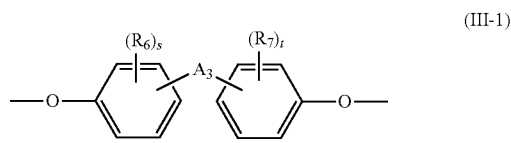

(III-1)

wherein $R_6$ and $R_7$ each independently represents a hydrogen atom, an aliphatic hydrocarbon group having 1 to 5 carbon atoms, or a halogen atom, $A_3$ represents an alkylene group having 1 to 5 carbon atoms, an isopropylidene group, an ether group, a sulfide group, a sulfonyl group, a carbonyloxy group, a ketone group, or a single bond, and s and t are each an integer of 1 to 4,

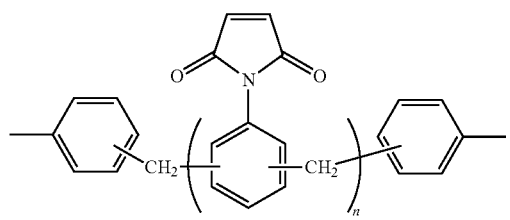

(IV)

wherein n is an integer of 1 to 10,

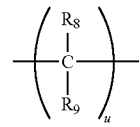

(V)

wherein $R_8$ and $R_9$ each independently represents a hydrogen atom or an aliphatic hydrocarbon group having 1 to 5 carbon atoms, and u is an integer of 1 to 8.

2. The polyphenylene ether derivative (A) according to claim 1, wherein the N-substituted maleimide group comprises at least one represented by the following formulas (I-1), (I-2), or (I-3):

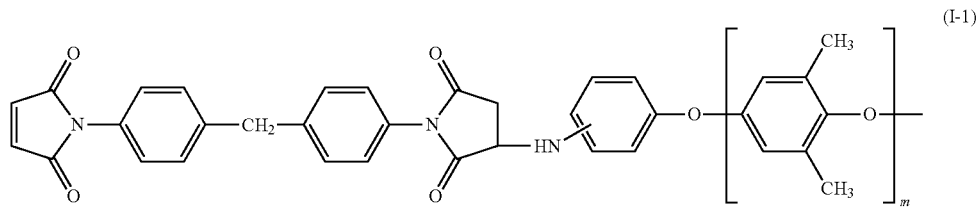

wherein m is as defined for the general formula (I),

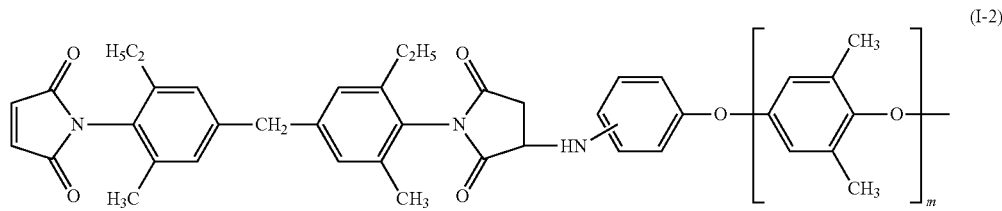

wherein m is as defined for the general formula (I),

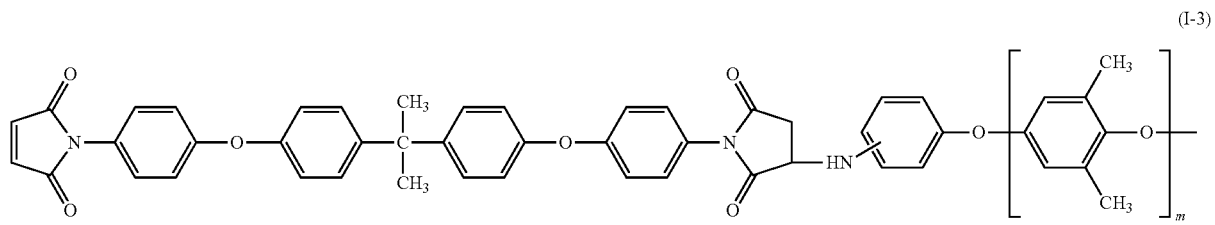

wherein m is as defined for the general formula (I).

3. A heat curable resin composition comprising the polyphenylene ether derivative (A) according to claim 1 and a thermosetting resin (B).

4. The heat curable resin composition according to claim 3, wherein the polyphenylene ether derivative (A) has a number average molecular weight of 5,000 to 12,000.

5. The heat curable resin composition according to claim 3, wherein the thermosetting resin (B) is at least one selected from the group consisting of an epoxy resin, a cyanate ester resin, and a maleimide compound.

6. The heat curable resin composition according to claim 5, wherein the maleimide compound as the thermosetting resin (B) comprises a bismaleimide compound (a) having at least two N-substituted maleimide groups in a molecule, or a polyaminobismaleimide compound (c) represented by the following general formula (VI):

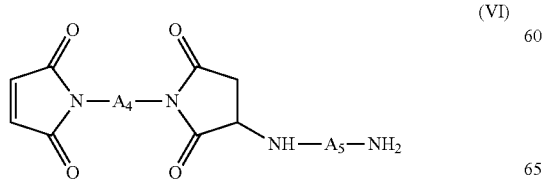

wherein $A_4$ is a residual group represented by one of the following general formulas (VII), (VIII), (IX), or (X), and $A_5$ is a residual group represented by the following general formula (XI):

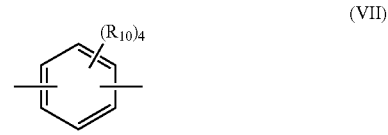

wherein $R_{10}$ each independently represents a hydrogen atom, an aliphatic hydrocarbon group having 1 to 5 carbon atoms, or a halogen atom,

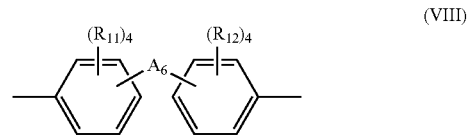

wherein $R_{11}$ and $R_{12}$ each independently represents a hydrogen atom, an aliphatic hydrocarbon group having 1 to 5 carbon atoms, or a halogen atom, and $A_6$ represents an alkylene group or alkylidene group having 1 to 5 carbon atoms, an ether group, a sulfide group, a sulfonyl group, a carbonyloxy group, a ketone group, a single bond, or a residual group represented by the following general formula (VIII-1):

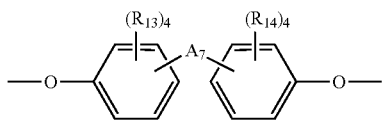
(VIII-1)

wherein $R_{13}$ and $R_{14}$ each independently represents a hydrogen atom, an aliphatic hydrocarbon group having 1 to 5 carbon atoms, or a halogen atom, and $A_7$ represents an alkylene group having 1 to 5 carbon atoms, an isopropylidene group, an ether group, a sulfide group, a sulfonyl group, a carbonyloxy group, a ketone group, or a single bond,

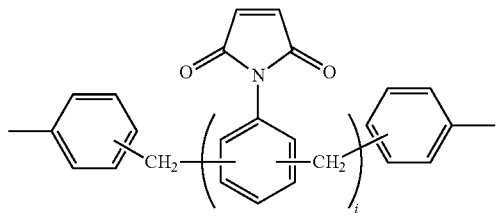
(IX)

wherein i is an integer of 1 to 10,

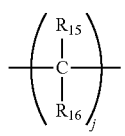
(X)

wherein $R_{15}$ and $R_{16}$ each independently represents a hydrogen atom or an aliphatic hydrocarbon group having 1 to 5 carbon atoms, and j is an integer of 1 to 8,

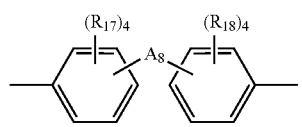
(XI)

wherein $R_{17}$ and $R_{18}$ each independently represents a hydrogen atom, an aliphatic hydrocarbon group having 1 to 5 carbon atoms, an alkoxy group having 1 to 5 carbon atoms, a hydroxyl group, or a halogen atom, and As represents an alkylene group or alkylidene group having 1 to 5 carbon atoms, an ether group, a sulfide group, a sulfonyl group, a carbonyloxy group, a ketone group, a fluorenylene group, a single bond, or a residual group represented by one of the following general formulas (XI-1) or (XI-2):

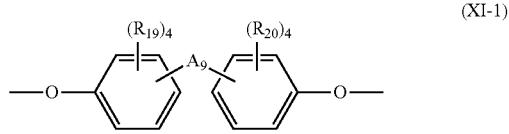
(XI-1)

wherein $R_{19}$ and $R_{20}$ each independently represents a hydrogen atom, an aliphatic hydrocarbon group having 1 to 5 carbon atoms, or a halogen atom, and $A^9$ represents an alkylene group having 1 to 5 carbon atoms, an isopropylidene group, a m- or p-phenylene-diisopropylidene group, an ether group, a sulfide group, a sulfonyl group, a carbonyloxy group, a ketone group, or a single bond,

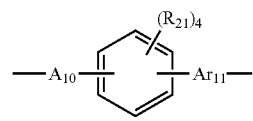
(XI-2)

wherein $R_{21}$ each independently represents a hydrogen atom, an aliphatic hydrocarbon group having 1 to 5 carbon atoms, or a halogen atom, and $A_{10}$ and $A_{11}$ each represents an alkylene group having 1 to 5 carbon atoms, an isopropylidene group, an ether group, a sulfide group, a sulfonyl group, a carbonyloxy group, a ketone group, or a single bond.

7. The heat curable resin composition according to claim 3, wherein the ratio of the polyphenylene ether derivative (A) and thermosetting resin (B) contained is in the range of: (A):(B) =(5 to 80% by mass):(95 to 20% by mass).

8. The heat curable resin composition according to claim 3, which further comprises an inorganic filler (C).

9. The heat curable resin composition according to claim 3, which further comprises a flame retardant (D).

10. The heat curable resin composition according to claim 3, which further comprises a curing accelerator (E).

11. The heat curable resin composition according to claim 3, which further comprises a phenolic antioxidant (F).

12. The heat curable resin composition according to claim 3, wherein the resin composition after being cured has a glass transition temperature of 200° C. or higher.

13. A resin varnish comprising the heat curable resin composition according to claim 3 and an organic solvent.

14. A prepreg obtained by applying the resin varnish according to claim 13 to a sheet-form fiber reinforced substrate, and drying the applied resin varnish.

15. A laminate obtained by stacking one sheet or more of the prepreg according to claim 14, and disposing a metal foil or foils on one side or both sides of the stacked material, and subjecting the resultant material to hot pressing.

16. A multilayer printed wiring board formed using the laminate according to claim 15 by performing circuit formation processing and bonding processing for forming a multilayer.

17. A method for producing the polyphenylene ether derivative (A) according to claim 1, the method comprising the steps of: reacting a phenol compound having at least one primary amino group in a molecule and being represented by the following general formula (XII) with a polyphenylene ether having a structure represented by the following general formula (XIII) and having a number average molecular weight of 15,000 to 25,000 in an organic solvent to produce a polyphenylene ether compound having a primary amino group; and reacting the obtained polyphenylene ether compound with a bismaleimide compound having at least two N-substituted maleimide groups in a molecule and being represented by the following general formula (XIV):

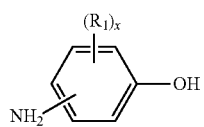
(XII)

wherein $R_1$ each independently represents a hydrogen atom, an aliphatic hydrocarbon group having 1 to 5 carbon atoms, or a halogen atom, and x is an integer of 1 to 4,

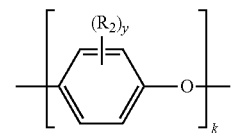
(XIII)

wherein $R_2$ each independently represents a hydrogen atom, an aliphatic hydrocarbon group having 1 to 5 carbon atoms, or a halogen atom, y is an integer of 1 to 4, and k is an integer of 1 or more,

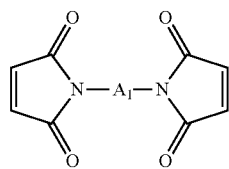
(XIV)

wherein $A_1$ is as defined for the general formula (I).

* * * * *